United States Patent
Sample et al.

(10) Patent No.: US 6,289,494 B1
(45) Date of Patent: *Sep. 11, 2001

(54) OPTIMIZED EMULATION AND PROTOTYPING ARCHITECTURE

(75) Inventors: Stephen P. Sample, Saratoga, CA (US); Michael R. Butts, Portland, OR (US)

(73) Assignee: Quickturn Design Systems, Inc., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/968,401

(22) Filed: Nov. 12, 1997

(51) Int. Cl.[7] .................................................. G06F 17/50
(52) U.S. Cl. ............................................................. 716/12
(58) Field of Search ................................. 364/488, 489, 364/490, 491, 578; 716/12

(56) References Cited

U.S. PATENT DOCUMENTS

| | | | |
|---|---|---|---|
| Re. 34,363 | 8/1993 | Freeman | 307/465 |
| Re. 34,444 | 11/1993 | Kaplinsky | 340/825.8 |
| 4,642,487 | 2/1987 | Carter | 307/465 |
| 4,775,942 | 10/1988 | Ferreri et al. | 364/491 |
| 4,870,302 | 9/1989 | Freeman | 307/465 |
| 4,922,441 | 5/1990 | Tsukagoshi et al. | 364/491 |
| 4,924,468 | 5/1990 | Horak et al. | 371/22.1 |
| 5,036,473 | 7/1991 | Butts et al. | 364/489 |
| 5,109,353 | 4/1992 | Sample et al. | 364/578 |
| 5,122,685 | 6/1992 | Chan et al. | 307/465 |
| 5,140,193 | 8/1992 | Freeman et al. | 307/465 |
| 5,208,491 | 5/1993 | Ebeling et al. | 307/465 |
| 5,255,203 | 10/1993 | Agrawal et al. | 364/489 |
| 5,260,881 * | 11/1993 | Agrawal | 364/489 |
| 5,315,178 | 5/1994 | Snider | 307/465 |
| 5,323,069 | 6/1994 | Smith, Jr. | 307/465 |
| 5,329,470 | 7/1994 | Sample et al. | 364/578 |
| 5,343,406 | 8/1994 | Freeman et al. | 364/490 |
| 5,345,580 | 9/1994 | Tamaru et al. | 395/500 |
| 5,352,123 | 10/1994 | Sample et al. | 439/61 |

(List continued on next page.)

FOREIGN PATENT DOCUMENTS

| | | | |
|---|---|---|---|
| 31 49 460 A1 | 6/1983 | (DE) | G01R/31/28 |
| 0 461 798 A2 | 12/1991 | (EP) | H03K/19/177 |
| 0 507 507 A2 | 10/1992 | (EP) | H03K/19/177 |
| 0 507 507 B1 | 7/1997 | (EP) | H03K/19/177 |

OTHER PUBLICATIONS

Quickturn and Cadence's Opposition to Mentor's Preliminary Injunction—Case No. C–00–03291 (SI) Redacted, Executed Feb. 5, 2001.

(List continued on next page.)

*Primary Examiner*—Matthew Smith
*Assistant Examiner*—Thuan Do
(74) *Attorney, Agent, or Firm*—Lyon & Lyon LLP

(57) ABSTRACT

A logic chip useful for emulation and prototyping of integrated circuits. The logic chip comprises a plurality of logic elements, which is divided into a plurality of subsets of logic elements. The logic chip further comprises a plurality of first level interconnects. The plurality of first level interconnects interconnect one of the plurality of subsets of logic elements, thereby forming a plurality of first level logical units. The plurality of first level logical units is divided into a plurality of subsets of first level logical units. The logic chip also comprises a plurality of second level interconnects. The second level interconnects interconnect one of the plurality of subsets of first level logic units, thereby forming a plurality of second level logic units. The logic chip also comprises a third level interconnect. The third level interconnect interconnects the plurality of second level logic units, thereby forming a third level logic

10 Claims, 16 Drawing Sheets

U.S. PATENT DOCUMENTS

| | | | |
|---|---|---|---|
| 5,359,536 | 10/1994 | Agrawal et al. | 364/489 |
| 5,376,844 | 12/1994 | Pedersen et al. | 326/41 |
| 5,384,499 | 1/1995 | Pedersen et al. | 326/39 |
| 5,396,126 | 3/1995 | Britton et al. | 326/41 |
| 5,424,589 | 6/1995 | Dobblelaere et al. | 326/41 |
| 5,425,036 | 6/1995 | Lui et al. | 371/23 |
| 5,448,496 | 9/1995 | Butts et al. | 364/489 |
| 5,452,231 | 9/1995 | Butts et al. | 364/489 |
| 5,455,525 | 10/1995 | Ho et al. | 326/41 |
| 5,457,409 | 10/1995 | Agrawal et al. | 326/39 |
| 5,457,410 | 10/1995 | Ting | 326/41 |
| 5,477,475 | 12/1995 | Sample et al. | 364/578 |
| 5,519,629 | 5/1996 | Snider | 364/490 |
| 5,530,958 | 6/1996 | Agarwal et al. | 395/403 |
| 5,544,069 | 8/1996 | Mohsen | 364/489 |
| 5,574,388 | 11/1996 | Barbier et al. | 326/41 |
| 5,612,891 | 3/1997 | Butts et al. | 364/489 |
| 5,617,042 | 4/1997 | Agrawal | 326/39 |
| 5,630,088 | 5/1997 | Gupta et al. | 395/417 |
| 5,642,058 | 6/1997 | Trimberger et al. | 326/41 |
| 5,649,176 | 7/1997 | Selvidge et al. | 359/551 |
| 5,659,716 | 8/1997 | Selvidge et al. | 395/500 |
| 5,671,432 | 9/1997 | Bertolet et al. | 395/800 |
| 5,682,107 | 10/1997 | Tavana et al. | 326/41 |
| 5,729,752 | 3/1998 | Snider et al. | 395/800 |
| 5,732,407 | 3/1998 | Mason et al. | 711/104 |
| 5,742,181 * | 4/1998 | Rush | 326/41 |
| 5,754,827 | 5/1998 | Barbier et al. | 395/500 |
| 5,777,489 | 7/1998 | Barbier et al. | 326/40 |
| 5,790,771 | 8/1998 | Culbertson et al. | 395/182.01 |
| 5,790,832 | 8/1998 | Barbier et al. | 395/500 |
| 5,812,414 * | 9/1998 | Butts | 364/489 |
| 5,821,773 | 10/1998 | Norman et al. | 326/39 |
| 5,999,725 | 12/1999 | Barbier et al. | 395/500 |
| 6,057,706 | 5/2000 | Barbier et al. | 326/39 |

OTHER PUBLICATIONS

Declaration of Prof. Scott A. Hauck In Opposition to Mentor's Preliminary Injunction—Case No. C–00–03291(SI) Unredacted, Executed Feb. 1, 2001 at Seattle Washington.

J.Rose, A.ElGamal, and A.Sangiovanni–Vincentelli; Architecture of Field–Programmable Gate Array; IEEE, vol. 81, No. 7 Jul. 1993.

R.Cliff, B.Ahanin, L.Cope, F.Heile, R.Ho, J. Juang, C.Lytle, S.Mashruwala, B.Pedersen, R.Raman, S.Reddy, V.Singhal, C.K.Sung, K. Veenstra, A.Gupta; A Dual Granularity and Globally Interconnected Architecture For A Programmable Logic Device; IEEE 1993, Custom Integrated Circuits Conference.

R.Amerson, R.Carter, W.Culbertson, P.Kuekes, G.Snider; Plasma: An EPGA For Million Gate Systems, FPGA 1996.

A.Agarwal and D.Lewis; Department of Electrical and Computer Engineering; 2nd International ACM/SIGDA Workshop on Field–Programmable Gate Arrays; FPGA 1994.

Rick Amerson and Phil Kuekes, "A Twenty–Seven Chip MCM–C" International Conference and Exhibition (Colorado, Apr. 1994) vol. 2256, pp. 578–582.

D.Hill, D. Cassiday; Preliminary Description of Tabula Rase, an Electrically Reconfigurable Hardware Engine; IEEE International Conference on Computer Design: VLSI in Computers & Processors 1990; pp. 391–395.

Pak K. Chan and Martine D.F. Schlag "Architectural Tradeoffs in Field–Programmable–Device–Based Computing Systems" IEEE Workshop on FPGAs for Custom Computing Machines (California, Apr. 1993) pp. 152–161.

Jonathan Rose, Robert J. Francis, David Lewis, and Paul Chow "Architecture of Field–Programmable Gate Arrays: The Effect of Logic Block Functionality on Area Efficiency" *IEEE Journal of Solid–State Circuits* (Oct. 1990) vol. 25, No. 5, pp. 1217–1225.

Xilinx, Inc., "Boundary Scan in XC4000 Devices" *The Programmable Logic Data Book* (1993) pp. 8–25–8–35.

Stephen Walters "Computer–Aided Prototyping for ASIC–Based Systems" *IEEE Design & Test of Computers* (Jun. 1991) pp. 4–10.

Tom Kean and John Gray "Configurable Hardware: Two Case Studies of Micro–Grain Computation." *Systolic Array Processors* (1989) pp. 310–319.

Richard W. Weiler, Zaifu Zhang, and Robert D. McLeod "Emulating Static Faults Using a Xilinx Based Emulator" IEEE Symposium on FPGAs for Custom Computing Machines (California, Apr. 1995) pp. 110–115.

The Technical Staff of Altera Corporation "Erasable Programmable Logic Devices" *Field–Programmable Gate Array Technology* (1994) pp. 186–193.

L. Burgun and F. Reblewski "First Generation of Meta–Systems Equipment Emulators" Symposium on New Machine Architectures (France, 1996) 24 pp. (English translation 24 pp.).

Ubaid R. Khan, Henry L. Owen, and Joseph L.A. Hughes "FPGA Architectures for ASIC Hardware Emulators" Proceedings of the Sixth Annual IEEE International ASIC Conference and Exhibit (1993) pp. 336–340.

J. Viitanen and T. Kean "Image Pattern Recognition Using Configurable Logic Cell Arrays" *New Advances in Computer Graphics* (Japan, 1989) pp. 355–368.

Tom Kean, John Gray, and Bernard Pruniaux "Implementation of Configurable Hardware Using Wafer Scale Integration" International Conference on Wafer Scale Integration (California, Jan. 1990) pp. 68–73.

P. Bertin, D. Roncin, and J. Vuillemin "Introduction to Programmable Active Memories" *Systolic Array Processors* (Mar. 1989) pp. 301–309.

Bernard S. Landman and Roy L. Russo "On a Pin Versus Block Relationship For Partitions of Logic Graphs" *IEEE Transactions on Computers* (Dec. 1971) vol. C–20, No. 12, pp. 1469–1479.

Dwight Hill and Nam–Sung Woo "The Benefits of Flexibility in Lookup Table–Based FPGA's" *IEEE Transactions on Computer–Aided Design of Integrated Circuits and Systems.* (Feb. 1993) vol. 12, No. 2, pp. 349–3535.

W. Bruce Culbertson, Toshiki Osame, Yoshisuke Otsuru, J. Barry Shackleford, and Motoo Tanaka "The HP Tsutsuji Logic Synthesis System" *Hewlett–Packard Journal* (Aug. 1993) vol. 44, No. 4, pp. 38–51.

Steven Casselman "Virtual Computing and The Virtual Computer" IEEE Workshop on FPGAs for Custom Computing Machines (California, Apr. 1993) pp. 43–48.

J.F. McDonald, S. Dabral, R. Philhower, and M. E. Russinovich "Wafer Scale Integration (WSI) of Programmable Gate Arrays (PGA's)" International Conference on Wafer Scale Integration (California, Jan. 1990) pp. 329–338.

Agarwal, Aditya A. and Lewis, David M., "Routing Architectures for Hierarchical Field Programmable Gate Arrays," $2^{nd}$ ACM/SIGDA Workshop on Field–Programmable Gate Arrays, 1994, pp. 1–10, sponsored by ACM Special Interest Group on Design Automation (SIGDA) with support from Actel, Altera, and Xilinx.

Amerson, R. et al., "Plasma: An FPGA for Million Gate Systems," *FPGA*, 1996, pp. 10–16, ACM, Inc., Monterey, CA, USA.

Cliff, Richard et al., "A Dual Granularity and Globally Interconnected Architecture for a Programmable Logic Device," IEEE 1993 Custom Integrated Circuits Conference, 1993, pp. 7.3.1–7.3.5, IEEE.

Rose, Jonathan et al., "Architecture of Field–Programmable Gate Arrays," Proceedings of the IEEE, Jul. 1991, pp. 1013–1028, vol. 81, No. 7, IEEE.

Hartmann, Robert, Ed., "Erasable Programmable Logic Devices," Chapter 4 of *Field–programmable Gate Array Technology* (Stephen M. Trimberger, ed.), 1994, pp. 186–193, Kluwer Academic Publishers, Norwell, MA, USA.

Whetsel, Lee, "At–Speed Board Test Simplified via Embeddable Data Trace/Compaction IC," Conference Record, IEEE Systems Readiness Technology Conference, Sep. 24–26, 1991, pp. 307–315, IEEE, Anaheim, CA, USA.

Wieler, Richard W. et al., "Emulating Static Faults Using a Xilinx Based Emulator," Proceedings—IEEE Symposium on FPGAs for Custom Computing Machines, Apr. 19–21, 1995, pp. 110–115, IEEE Computer Society Press, Los Alamitos, CA, USA.

Burgun, L. and Reblewski, F., "Première Génération d'Emulateurs Matériels Meta Systems," Presentation at Symposium Architectures Nouvelles de Machines, Rennes—1996, 24 pp. (copies of transparencies).

Morales, Luis, "Boundary Scan in XC4000 Devices," *The Programmable Logic Data Book*, 1993, pp. 8–25–8–35, XAPP 017.002, Xilinx, San Jose, CA, USA.

(Author Unknown), *The Programmable Gate Array Data Book*, 1988, 8 Sections, pp. 1–1 through 8–5, Xilinx, San Jose, CA USA.

(Author Unknown), *The Programmable Gate Array Design Handbook*, First Edition, 1986, 4 sections, 3 appendices, pp. 1–1–4–32, appendices A–1 through A–10, Xilinix, San Jose, CA, USA.

(Author Unknown), *The Programmable Gate Array Logic Data Book*, 1993, 10 sections, pp. 1–1–10–8, Xilinx, San Jose, CA, USA.

U.S. application No. 08/824,535 Filed on Mar. 26, 1997.

W.Moore, W.Luk; Field–Programmable Logic and Applications $5^{th}$ International Workshop, FPI '95; Oxford, United Kingdom, Aug. 29–Sep. 1, 1995 Proceedings.

R.Amerson, R.Carter, W.Culbertson, P.Kuekes, G.Snider; IEEE Computer Society Technical Committee on Computer Architecture; Teramac Configurable Custom Computing Palo Alto, CA 94304.

S. Wilton, J. Rose and Z Vranesic; Architecture of Centralized Field–Configurable Memory; Department of Electrical and Computing Engineering University of Toronto; Toronto Canada.

N. Bhat, K. Chaudhary and E. Kuh; Performance–Oriented Fully Routable Dynamic Architecture For A Field Programmable Logic Device; Electronics Research Laboratory, College of Engineering University of California Berkeley; Jun. 1993.

E. Dobbelaere; A Gamal, D. Howland and B. Kleveland; Field Programmable MCM Systems—Design of an Interconnection Frame; First International ACMSIGDA Workshop on Field Programmable Gate Arrays; Feb. 16–18, 1992.

Xilinx; The XC4000 Data Book; SC4000 Logic Cell Array Family; Aug. 1992.

Xilinx; Virtex 2.5 V Field Programmable Gate Arrays; Oct. 6, 2000.

Declaration of Prof. Scott A. Hauck in Opposition to Mentor's Preliminary Injunction; Civil Action No. C00–03291 SI; Confidential Information Redacted; Feb. 1, 2001.

Declaration of Dr. Edward J. McCluskey in Opposition to Mentor's Preliminary Injunction; Civil Action No. C00–03291 SI; Feb. 1, 2001; Curriculum Vitae of Edward J. McCluskey.

* cited by examiner

OPTIMIZED EMULATION AND PROTOTYPING ARCHITECTURE

FIELD OF THE INVENTION

The present invention pertains to the field of programmable logic device architectures, and more particularly to a logic block and programmable interconnect network specially adapted for use as an optimized emulation and prototyping logic chip.

BACKGROUND OF THE INVENTION

General purpose programmable logic chips that are available as off-the-shelf components (i.e., are commercially available) are generally not custom designed for special applications such as logic emulation, prototyping and computing. Examples of a general purpose programmable logic chips are field programmable gate arrays ("FPGAs"), programmable logic arrays ("PLAs"), and programmable array logic ("PALs"). General-purpose programmable logic chips have served adequately in the initial development of applications such as hardware logic emulation, prototyping and computing. However, in these applications, general-purpose logic chips have some drawbacks. Many general-purpose logic chips emphasize speed and density (i.e., how many logic gates can be implemented in a single chip) above other goals. To be cost effective for most applications, a general-purpose programmable logic architecture should provide routing resources sufficient to give a good chance of fitting a design therein and allowing the use of most of the available logic gates in the integrated circuit. However, with a general-purpose programmable logic architecture, there is always a possibility that a given design or partition may not be implementable, even though the gate count (i.e., the number of gates that the manufacturer of the programmable logic chip claims the chip can implement) is within the rated capacity of the chip. Also, the speed of the compile process is of lesser importance in the general purpose logic chip.

In contrast, in a logic emulation, prototyping or computing application, the priorities are different. The logic chip is normally part of a larger, multi-chip system, often with tens or hundreds of logic chips. Large input design netlists must be automatically compiled into all these logic chips with a very high degree of success and a minimum of user intervention. A netlist is a description of a logic design that specifies the components of the design (e.g., the logic gates) and how the components are interconnected. Each "net" of a netlist defines a circuit path between pins on a component or an input/output pad. It is essential that the logic chip used in these applications provide routing resources which are flexible and capable enough to nearly always succeed in allowing most of the logic resources to be used by a filly automatic compile process. This compile process should execute rapidly. Fast compile times minimize the time required to get from the time the user's design is presented to the emulator system to the time all the logic chips are programmed and ready to run the user's design (i.e., emulate the user's design).

The differences between the goals of the general purpose logic chip and the goals of a logic chip used in emulation, prototyping and computing applications present a situation where there is a need for a logic chip which is specialized for logic emulation, prototyping and computing applications.

SUMMARY OF THE INVENTION

The present invention is directed to a programmable logic device architecture that is particularly useful in logic emulation, prototyping and/or computing applications. A particular embodiment of the present invention comprises a plurality of logic elements, which is divided into a plurality of subsets of logic elements. In a preferred embodiment of the present invention, each of the plurality of logic elements comprises data selector logic.

The logic chip further comprises a plurality of first level interconnects. The plurality of first level interconnects interconnect one of the plurality of subsets of logic elements, thereby forming a plurality of first level logical units. The plurality of first level logical units is divided into a plurality of subsets of first level logical units. The logic chip also comprises a plurality of second level interconnects. In a preferred embodiment, the plurality of second level interconnects comprises a partial crossbar interconnect. The second level interconnects interconnect one of the plurality of subsets of first level logic units, thereby forming a plurality of second level logic units. The logic chip also comprises a third level interconnect. In a preferred embodiment, the third level interconnect comprises a partial crossbar interconnect. The third level interconnect interconnects the plurality of second level logic units, thereby forming a third level logic unit.

In a particular aspect of the present invention, the plurality of first level interconnects comprise a plurality of fully and partially populated crossbars. A particular embodiment of a partially populated crossbar can comprise a plurality of groups of inputs and a plurality of multiplexers. Each of the plurality of multiplexers comprises at least two data inputs, at least one select input and at least one output. Each input of the plurality of groups of inputs electrically communicates with the data inputs of one of the plurality of multiplexers. At least one select input on each of the plurality of multiplexers is electrically connected to a decoder, which is electrically connected to a programming cell. A programmable crosspoint is in electrical communication between the output of each of the plurality of multiplexers and the crossbar output pin. The programmable crosspoint comprises a pass transistor and a programmable memory cell.

The partial crossbar architecture used in the preferred second and third level interconnects is powerful, flexible and reduces the amount of time it takes to compile a users design into a system-level logic emulation application.

Implementations of partial crossbar interconnects on a chip may take different forms than they do at the system level, since the logic blocks being interconnected, the crossbars and the interconnecting wires are all in the same medium, not separated into different packages. This invention includes several ways of implementing partial crossbar interconnections on a chip. The partial crossbar interconnect may be applied hierarchically, using multiple levels of crossbars to span large numbers of logic blocks more efficiently than a single-level partial crossbar interconnect.

The above and other preferred features of the invention, including various novel details of implementation and combination of elements will now be more particularly described with reference to the accompanying drawings and pointed out in the claims. It will be understood that the particular methods and circuits embodying the invention are shown by way of illustration only and not as limitations of the invention. As will be understood by those skilled in the art, the principles and features of this invention may be employed in various and numerous embodiments without departing from the scope of the invention.

BRIEF DESCRIPTION OF THE DRAWINGS

Reference is made to the accompanying drawings in which are shown illustrative embodiments of aspects of the invention, from which novel features and advantages will be apparent.

FIG. 24 is a chart showing an example population pattern for crosspoints in the X0 output crossbar of FIG. 23.

DETAILED DESCRIPTION OF THE DRAWINGS

Figure 1:
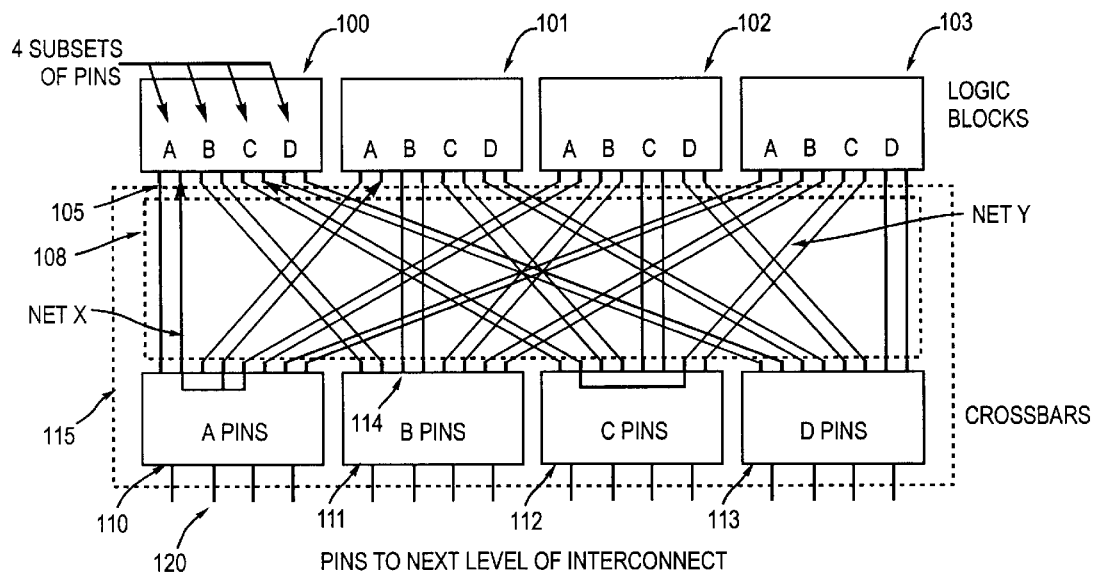
FIG. 1 is a block diagram of a partial crossbar interconnect structure.

Turning to the figures, the presently preferred apparatus and methods of the present invention will now be described.

The following general discussion provides a general background with reference to FIGS. 1–13, as well as for a preferred embodiment disclosed below in connection with FIGS. 14–24. Additional, detailed description of programmable logic systems and interconnect networks can be found in U.S. Pat. Nos. 5,036,473, 5,109,353, 5,448,496, and 5,452,231, each of which is assigned to the assignee of the present application. The disclosures of U.S. Pat. Nos. 5,036,473, 5,036,353, 5,448,496, and 5,452,231 incorporated herein by reference in their entireties.

For a device to be useful as a logic chip for emulation:

1) It should have the ability to be configured according to any digital logic network consisting of combinational logic (and optionally storage), subject to capacity limitations.

2) It should be electronically reconfigurable, in that its function and internal interconnect may be configured electronically any number of times to suit many different logic networks.

3) It should have the ability to freely connect input/output pins with the digital network, regardless of the particular network or which input/output pins are specified, to allow the emulation system partial crossbar or direct interconnect to successfully interconnect logic chips.

The present invention contains internal logic blocks which can be programmed to provide combinational logic functions (e.g., AND gates, OR gates, etc.), sequential logic functions (e.g., flip-flops, latches, etc.) and storage functions. Each logic block contains a plurality of input/output ("I/O") pins which are used to interconnect the logic blocks to circuitry outside of each particular logic block. The present invention also comprises external input/output ("I/O") pads and programmable interconnect. External I/O pads allow for connection to other chips and devices. Programmable interconnect acts to pass signals among the logic blocks and/or I/O pads. In particular, the programmable interconnect uses a partial crossbar interconnect architecture. To be interconnectable by partial crossbar interconnects, each logic block has the characteristics described above with respect to the entire logic chip. Specifically, each logic block should (1) have the ability to be configured according to any digital logic network consisting of combinational logic (and optionally storage), subject to capacity limitations; (2) be electronically reconfigurable, in that its function and internal interconnect may be configured electronically any number of times to suit many different logic networks; and (3) have the ability to freely connect I/O pins with the digital network, regardless of the particular network or which I/O pins are specified, thereby allowing the partial crossbar interconnect to successfully interconnect logic blocks.

In this invention, the logic blocks within the programmable logic chip meet these criteria Therefore they are equivalent to the "Realizer logic chips", as defined in U.S. Pat. Nos. 5,036,473, 5,448,496, and 5,452,231. The I/O pins of a logic block are its terminals for signals passing between it and other internal components of the same programmable logic chip, not to be confused with the programmable logic chip's external I/O pads, which may be connected to external I/O pins when the chip is packaged.

Partial Crossbar Interconnect Architecture

In the partial crossbar interconnect utilized by the present invention, programmable crossbars interconnect the logic blocks. The I/O pins of each logic block are divided into proper subsets, using the same division on each logic block. The pins of each crossbar are connected to the same subset of pins from each of every logic block. Thus, crossbar 'n' is connected to subset 'n' of each logic block's pins. As many crossbars are used as there are subsets, and each crossbar has as many pins as the number of pins in the subset times the number of logic blocks. Each logic block/crossbar pair is interconnected by as many wires, called paths, as there are pins in each subset.

Since each crossbar is connected to the same subset of pins on each logic block, an interconnection from an I/O pin in one subset of pins on one logic block to an I/O pin in a different subset of pins on another logic block cannot be configured. This is avoided by interconnecting each net using I/O pins from the same subset of pins on each of the logic blocks to be interconnected, and configuring the logic blocks accordingly.

FIG. 1 shows a schematic block diagram of an example of a partial crossbar interconnect of the present invention. Interconnect 115 comprises four crossbars (first crossbar 110, second crossbar 111, third crossbar 112 and fourth crossbar 113) and a plurality of wires 108. Each of the four crossbars 110, 111, 112, and 113 have eight pins 114. Each of the logic blocks 100, 101, 102, and 103 has 8 pins 105, divided into four subsets of two each, named A, B, C and D. Each crossbar connects to the same two pin subset of each logic block. Thus, the first crossbar 110 can interconnect any of the A-subset pins of the four logic blocks 100, 101, 102, and 103. Second crossbar 111 can interconnect any of the B-subset pins of the four logic blocks 100, 101, 102, and 103. Third crossbar 112 can interconnect any of the C-subset pins of the four logic blocks 100, 101, 102, and 103. Finally, fourth crossbar 113 can interconnect any of the D-subset pins of the four logic blocks 100, 101, 102, and 103. Crossbars 110, 111, 112 and 113, with the wires 108 connecting them to the logic blocks 100, 101, 102, and 103, together make up a partial crossbar interconnect 115.

An example of how a net is implemented in logic chip utilizing the partial crossbar architecture of the present invention is shown in FIG. 1. Design net X has a source in third logic block 102, and must be connected to destinations in first logic block 100 and second logic block 101. Any of the four crossbars has the inherent capability to accomplish such an interconnection. In this example, first crossbar 110 and thus the A-subset logic block pins are chosen. First crossbar 110 will be programmed such that a pin connected to the source logic block, third logic block 102, will be routed through to pins connected to first logic block 100 and second logic block 101. The third logic block 102 will be programmed to connect the source of the net to its A-subset pin, which is wired to the pin of first crossbar 110 chosen for this net. Likewise, first logic block 100 and second logic block 101 will be programmed to connect the destinations to their A-subset pins which are wired to the pins of crossbar 110 chosen for this net. Similarly, design net Y is interconnected by choosing third crossbar 112 and thus the C-subset logic block pins for it. Fourth logic block 103 and first logic block 100 and third crossbar 112 are programmed accordingly.

The collection of logic blocks 100, 101, 102, 103 and crossbar interconnects 110, 111, 112, 113 can itself act as a single higher-level logic block. In the example of FIG. 1, the logic blocks 100, 101, 102 and 103, interconnected by the partial crossbar interconnect 115, can act as a single higher-level logic block. When used as a single high-level logic block, each crossbar 110, 111, 112 and 113 has additional terminals 120 that serve as I/O pins. Terminals 120 carry signals in and out of this higher-level logic block.

Figure 2:
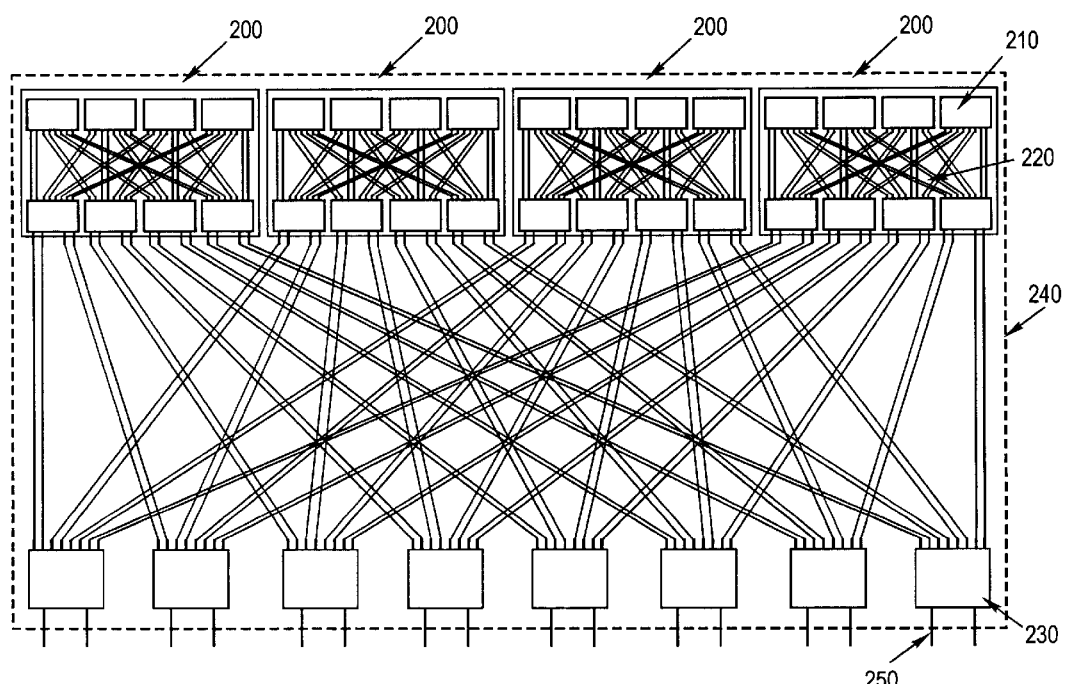
FIG. 2 is a block diagram of a second-level partial crossbar interconnect structure.

Such higher-level logic blocks may themselves be hierarchically interconnected by a partial crossbar interconnect as shown in FIG. 2. Four second-level logic blocks 200, each consist of first-level logic blocks 210, interconnected by a partial crossbar interconnect 220. These logic blocks 200 are interconnected by a second-level partial crossbar interconnect 240, containing second-level crossbars 230. This collection of second-level logic blocks 200 and partial crossbar interconnect 220 can itself act as logic block at a still higher third level, and so on. Each crossbar 230 has additional terminals 250, which serve as I/O pins, to carry signals in and out of this third-level logic block.

Hierarchical interconnection of logic blocks takes advantage of the fact that most user designs (i.e., the input logic design) that are emulated by these programmable logic devices are, in general, more richly interconnected locally (i.e., at the lowest level of the design), and less richly interconnected globally (i.e., at the highest level of the design). The first-level logic blocks (i.e., logic blocks 100, 101, 102, 103) are usually richly interconnected only in small groups, comprising basic functions in the input logic design, such as arithmetic units, control logic networks, counters and the like. These basic functions are generally connected to one another to form higher level functions. Less richness of interconnect is needed between the basic functions than is needed inside of the basic functions. Providing a single level interconnect among all the first-level logic blocks on a chip is unduly expensive when there is a large number of first-level logic blocks on one chip. The reason for this is that the richness of interconnection needed locally among a small number of logic blocks would be duplicated globally among all logic blocks if there were only a single level of interconnect. Instead, a hierarchical multi-level interconnect can reflect the locality of interconnect, and accomplish the interconnection of all first-level logic blocks more economically.

Hierarchical Programmable Logic Chip

Figure 3:
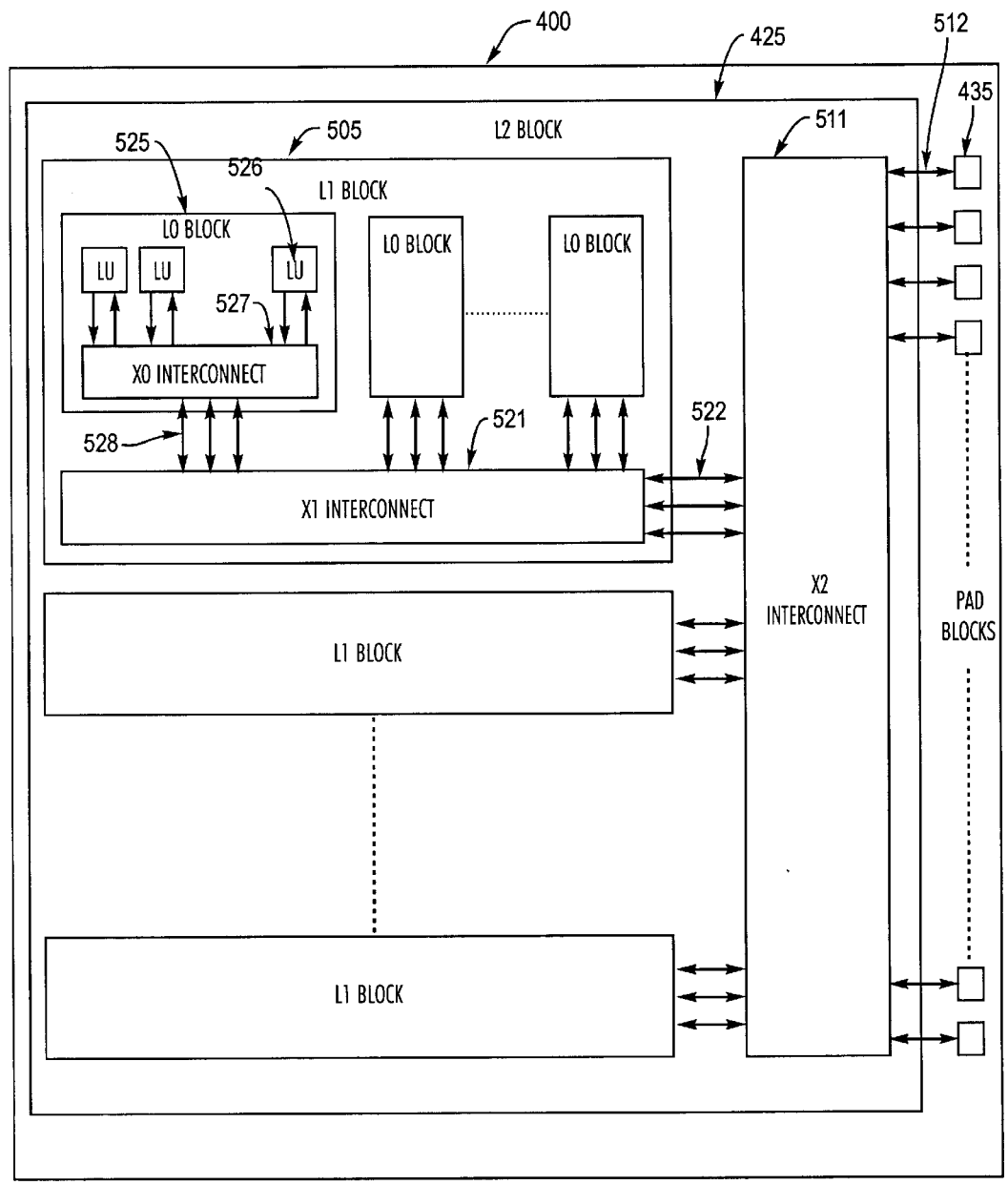
FIG. 3 is a block diagram of a hierarchy of logic blocks and interconnects.

A programmable logic chip with three levels of hierarchy is shown in FIG. 3. The first-level logic block will be referred to as the L0 block 525. It contains a number of logic units (LU) 526, each of which can provide a small combinational logic function and/or a small amount of storage. The LUs 526 are interconnected by an interconnect that will be referred to as X0 interconnect 527. X0 interconnect 527 also comprises I/O pins 528 that allow for connections to the next level of interconnect.

The second-level logic block will be referred to as the L1 block 505. It contains a number of L0 logic blocks 525 that are interconnected by an interconnect which will be referred to as X1 interconnect 521. X1 interconnect 521 also has I/O pins 522 for connections to the next level up. The third-level logic block will be referred to as the L2 block 425. L2 block 425 contains a number of L1 logic blocks 505. L1 logic blocks 505 are interconnected by an interconnect which will be referred to as X2 interconnect 511. X2 interconnect 511 has I/O pins 512. In the presently preferred embodiment of the invention, a single L2 logic block comprises an entire programmable logic chip. Its I/O pins 512 connect to chip I/O pads 435, which may be connected to external pins or leads when the chip is packaged.

Enough I/O pins should be provided to support the logic capacity of the logic blocks at each level. The preferred size of each of the X0 interconnect 527, X1 interconnect 521 and X2 interconnect 511 is a function of how many I/O pins must be interconnected. An optimum balance should be struck between the total number of levels used, the sizes of the logic blocks at each level, the numbers of logic block I/O pins at each level, and the resulting size of the interconnects.

The multi-level hierarchically interconnected programmable logic chip of FIG. 3 may use one or more of many different architectures internal to its X0 interconnect 527, X1 interconnect 521 and X2 interconnect 511. In the discussion to follow, crossbar-based architectures are used, either a single simple crossbar, fully or partially populated, or else a partial crossbar interconnect comprising multiple simple crossbars.

Crossbars

Figure 4:
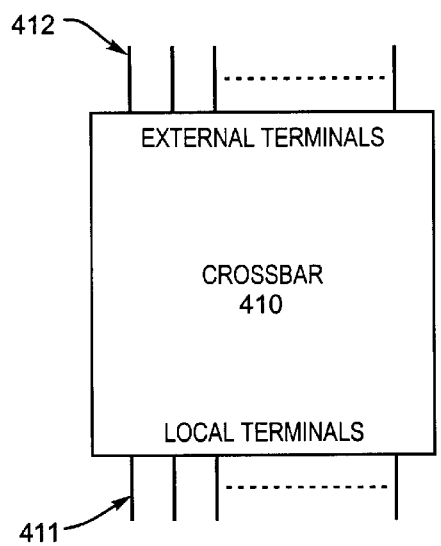
FIG. 4 is a block diagram depicting a crossbar.

A schematic block diagram of a simple crossbar 410 is shown in FIG. 4. Crossbar 410 can be programmed to establish connections between the local terminals 411. If the crossbar 410 is fully populated, then any connection from any local terminal 411 to one or more other local terminals 411 may be programmed. If it is partially populated, then some connections, but not all such connections, may be programmed. Partially populated crossbars are less costly in hardware, but less capable at interconnection, and may require more complicated software or additional software routines to determine connections.

External terminals 412 for crossbar 410 are shown in FIG. 4. Crossbar 410 can establish connections between external terminals 412 and local terminals 411, but not necessarily between external terminals 412 and other external terminals 412. When crossbar 410 is used in a partial crossbar interconnect, the local terminals 411 are connected to the logic blocks being interconnected, and the external terminals 412 are used as I/O pins for the resulting higher-level logic block.

Figure 5:
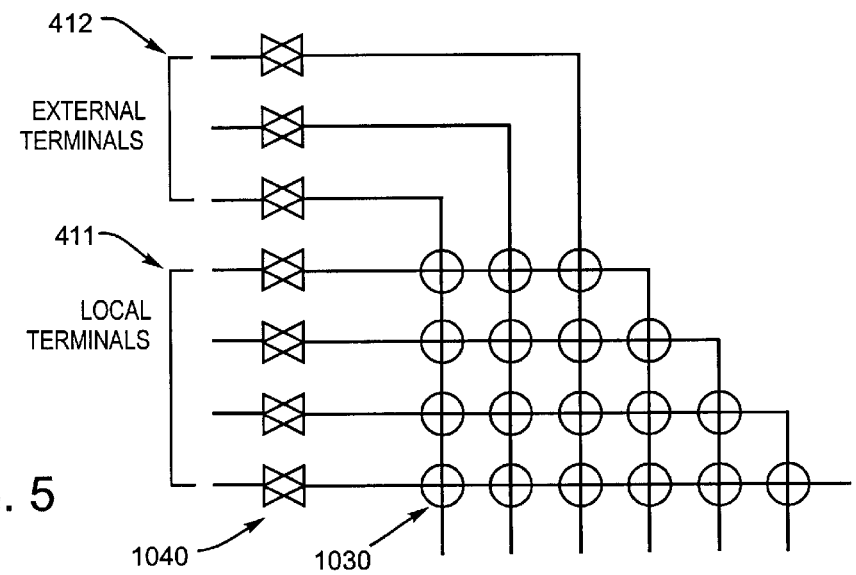
FIG. 5 is a block diagram detailing a crosspoint-type structure of the crossbar of FIG. 4.
Figure 5A:
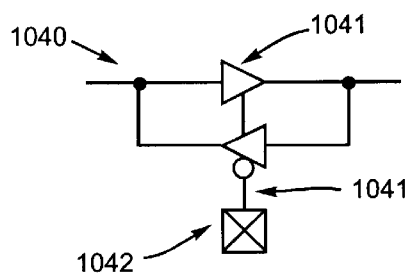
FIG. 5A is a schematic diagram of a presently preferred bidirectional transceiver used in the crosspoint-type structure shown in FIG. 5.

Internal structure of one possible form of crossbar 410, a crosspoint-type crossbar, is shown in FIG. 5. Each of the local terminals 411 and the external terminals 412 is connected to a programmable bidirectional transceiver 1040. A schematic diagram of a presently preferred bidirectional transceiver 1040 is shown in FIG. 5A. Each transceiver 1040 has a pair of drivers 1041. Each driver 1041 is controlled by programming a memory cell 1042. Programming memory cell 1042 may be built as an SRAM cell, a flip-flop, a latch, or any other structure that will hold a bit of programming information on its output. Such structures are known to those skilled in the art and, as such, their programming facilities are not shown. If the programmable memory cell 1042 is set to zero, one driver 1041 is on and the other is off, thus conducting signals in one direction through the transceiver 1040. If the programmable memory cell 1042 is set to one, the condition is reversed, which causes driver 1041 to drive signals in the opposite direction. Thus, each terminal is programmed to be either an input to the crossbar or an output to the crossbar 410. When programmed as an input to the crossbar 410, the terminal drives signals into the crossbar 410 from the outside world. When programmed as an output from the crossbar 410, the terminal drives signals from the crossbar to the outside world.

Figure 5B:
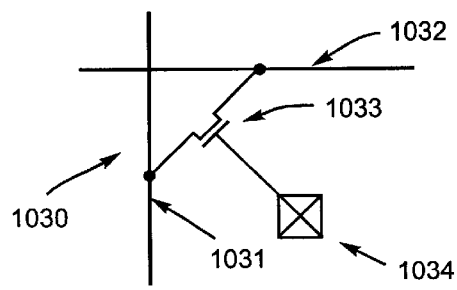
FIG. 5B is a schematic diagram of a presently preferred crosspoint used in the crosspoint-type structure shown in FIG. 5.

Each transceiver 1040 is connected to an internal wire. These wires are arranged logically in a matrix, and pairs of wires are joined by crosspoints 1030. Each crosspoint 1030 has a programming memory cell 1034, which controls a pass transistor 1033, either turning it on to be passing signals, or off to be blocking them. An example of this circuit can be seen in FIG. 5B. The source and drain of pass transistor 1033 join the two wires 1031 and 1032, respectively, thereby passing signals driven by the transceivers 1041 in either direction or blocking them. Crosspoints 1030 are arranged so as to allow connections to be programmed between the local terminals 411 and external terminals 412. As shown, the example of FIG. 5 has crosspoints 1030 to permit any local terminal 411 to be connected to any one or more other local terminals 411. It also has crosspoints 1030 that can establish connections between external terminals 412 and local terminals 411, but not directly between external terminals 412 and other external terminals 412. Other forms of implementation of crossbars 410 are within the scope of the invention, so long as enough routability is available to satisfy the application. Other preferred forms of implementation more suitable to this chip-level application are shown below.

Partial Crossbar Interconnected Programmable Logic Chip

Figure 6:
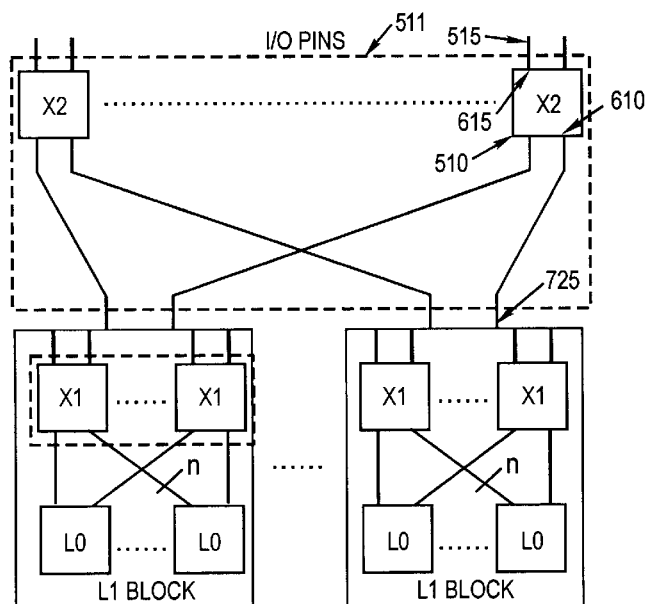
FIG. 6 is a block diagram of a two-level hierarchical partial crossbar interconnect, interconnecting L0 and L1 logic blocks.

A partial crossbar interconnect is shown in FIG. 6. FIG. 6 shows an example of interconnect implementations for the hierarchically interconnected programmable logic chip depicted in FIG. 3. This comprises a single L2 logic block 425. In this example, the X1 interconnect 521 and X2 interconnect 511 are each partial crossbar interconnects. Together the X1 interconnect 521 and X2 interconnect 51 1 form a two-level hierarchical partial crossbar interconnect. The X2 interconnect 511 comprises X2 crossbars 510, each of which are each instances of a crossbar 410 (shown in FIG. 4), with local terminals 610 and external terminals 615, and the wires connecting the local terminals 610 with the L1 logic block I/O pins 725.

The X2 crossbars 510 are connected to L1 logic blocks 505 such that the I/O pins 725 of each L1 logic block 505 are divided into proper subsets, using the same division on each L1 logic block 505. The local terminals 610 of each X2 crossbar 510 are connected to the same subset of I/O pins 725 from each of every L1 logic block 505. Only the outermost wires of the network of wires connecting crossbars 510 with L1 logic blocks 505 are shown, being far too many to show in the diagram individually. The other such wires are according to the above definition also exist although they are not shown in FIG. 6. The external terminals 615 are connected to the L2 logic block I/O pins 515.

Figure 7:
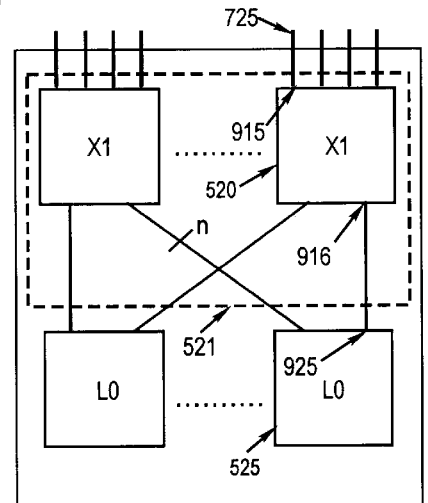
FIG. 7 is a block diagram of the L1 block of FIG. 6.

The components of each L1 logic block 505 are shown in FIG. 7. The X1 interconnect 521 consists of X1 crossbars 520 with local terminals 916 and external terminals 915, that are each instances of crossbar 410 (shown in FIG. 4), and the wires connecting the local terminals 916 with the L0 logic block I/O pins 925. In this X1 interconnect 521, X1 crossbars 520 are connected to L0 logic blocks 525 such that the I/O pins 925 of each L0 logic block 525 are divided into proper subsets, using the same division on each L0 logic block 525. The local terminals 916 of each X1 crossbar 520 are connected to the same subset of I/O pins 725 from each of every L1 logic block 505. The external terminals 915 are connected to the I/O pins 725 of the L1 logic block 505, which are connected to the X2 crossbars 510 as shown in FIG. 6.

Depending on the number of L0 logic blocks 525, the number of I/O pins 925 on each L0 logic block 525, the number of X1 crossbars 520, and the number of local terminals 916 on each X1 crossbar 520, there will be some number "n" of wires between each L0 block 525 and X1 crossbar 520 pair. For example, if there were 8 L0 logic blocks 525 with 64 I/O pins 925 on each, and 16 X1 crossbars 520 with 32 local terminals 916 on each, then "n" would equal 4, that is, there would be 4 wires between each L0 block 525 and X1 crossbar 520 pair. The higher the value of "n", the greater the ease of routing and the higher the likelihood of routing success.

Chip-Oriented Crossbar and Partial Crossbar Interconnect Implementations

Figure 8:
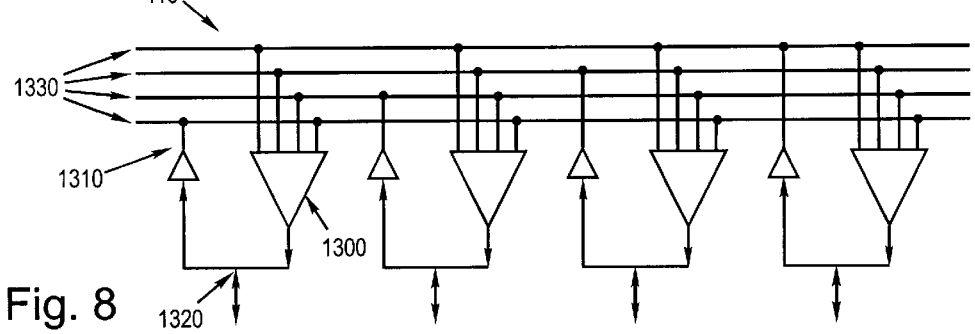
FIG. 8 is a block diagram illustrating a crossbar circuit and layout technique that uses multiplexers with hard-wired line drivers.

Other means of implementing crossbars 410 are more suitable for use in a programmable logic chip because they are more congruent with the rectilinear layout of components on a single silicon die, as is commonly practiced when laying out integrated circuits, and because these other implementations have operational advantages. FIG. 8 shows a crossbar 410 implemented as a multiplexer-type crossbar. Each of the four terminals 1320 corresponds to a local terminal 411 or an external terminal 412. The driver 1310 always drives the logic value on terminal 1320 onto one of the wires 1330. Note that wires 1330 are horizontal only for the sake of illustration in the diagram. In actual implementation, each wire 1330 need not be horizontal. Each terminal 1320 thus has a wire 1330 always carrying its logic value. Each terminal 1320 is also drivable by a programmable multiplexer 1300, which can be programmed to select one of the wires 1330, and may also be programmed to drive its logic value onto terminal 1320 or not. If the terminal 1320 is to be an output from this crossbar 410, its multiplexer 1300 is programmed to drive the terminal and to select the wire 1330 driven by desired input terminal 1320. If instead, the terminal 1320 is to be an input to the crossbar 410, the multiplexer is programmed to not drive the terminal.

This multiplexer implementation of crossbar 410 has the operational advantage that the propagation delay through it is relatively insensitive to the crossbar's programming. This is less true with the crosspoint-type crossbar, as shown in FIG. 5. Also, the multiplexer need not be implemented with passive pass transistors, like the transistors 1033 of FIG. 5, but can be implemented instead with active logic circuits, which can permit faster operation. Also the multiplexer naturally has a rectangular shape, which may reach across long distances on the chip, which is physically advantageous when used to construct partial crossbar interconnects.

Figure 9A:
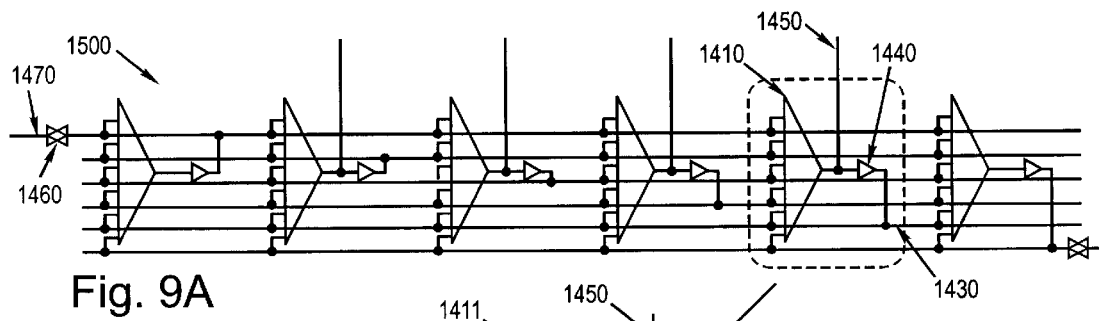
FIG. 9A is a block diagram of a six-pin crossbar with hard-wired crosspoints according to the technique of FIG. 8.
Figure 9B:
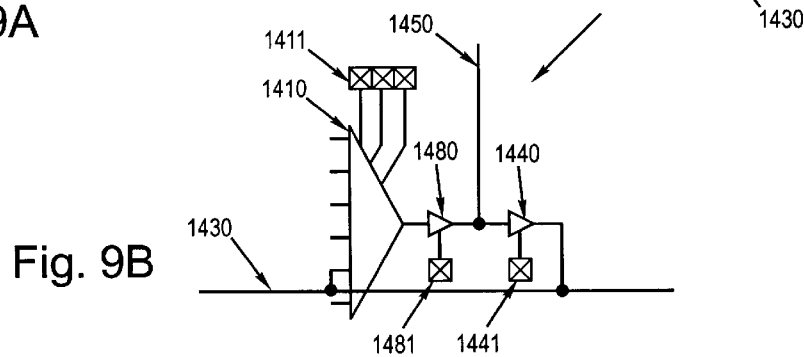
FIG. 9B is a schematic block diagram of a programmable multiplexer of the six-pin crossbar of FIG. 9A.

A similar multiplexer-type crossbar 410 implementation is shown in FIGS. 9A and 9B. Each of the terminals 1450 and 1470 corresponds to a local terminal 411 or an external terminal 412. The programmable tri-state driver 1440 drives the logic value on terminal 1450 onto one of the wires 1430 if it is programmed by programming memory cell 1441 to be in the driving state. Each terminal 1450 has a programmable multiplexer 1410 which can be programmed by programming memory cells 1411 to select one of the wires 1430. As seen in FIG. 9B, the multiplexer-selected logic value is driven onto terminal 1450 using programmable driver 1480 if programmable driver 1480 is programmed by programming memory cell 1481 to be driving. If the terminal 1450 is to be an output from this crossbar 410, its multiplexer 1410 and driver 1480 is programmed to drive the terminal and to select the desired wire 1430. If the terminal 1450 is to be an input, the driver 1480 is programmed to not drive the terminal. These terminals 1450 are naturally arrayed across the crossbar 410 structure, and are useful for connections to devices on the top or bottom of this structure on the chip.

Each terminal 1470 may be connected to a wire 1430. If the terminal 1470 is to be an output, then the multiplexer 1410 and drivers 1440 and 1480 which drive its wire 1430 are programmed to select the desired input and to drive this wire 1430. The bidirectional transceiver 1460 is then programmed to drive the external terminal 1470. If the terminal 1470 is to be an input, its wire 1430's programmable bidirectional transceiver 1460 is programmed to drive its logic value onto the wire. These terminals 1470 are naturally located at the ends of the crossbar 410 structure, and are useful for connections to devices on the left or right ends of this structure on the chip.

FIGS. 10a–10d illustrate the variations of physical signal paths possible with these crossbar 410 implementation structures. Depending on the desired physical arrangement of the structures on the logic chip, such as logic blocks and I/O pins, which connect with this crossbar 410, one of the variations appropriate to the particular path to be routed may be chosen. The multiplexer output driver 1480, and all the programming memory cells 1411, 1441 and 1481, are not shown in the FIGS. 10a–10d in the interest of clarity. They can be seen in FIG. 9B.

Figure 10A:
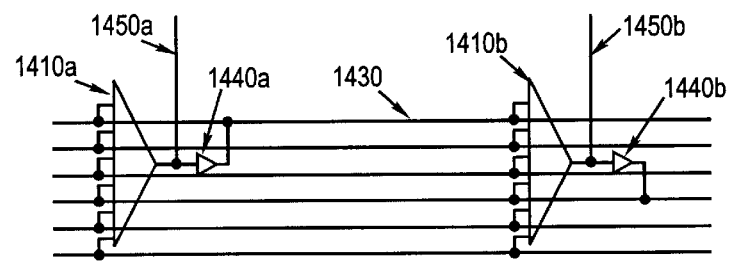
FIGS. 10A–D are block diagrams illustrating various layout configuration versions of the six-pin crossbar of FIG. 9.

In FIG. 10a, a signal is input to the crossbar on terminal 1450a on the top edge of the structure, and routed through to output terminal 1450b, also on the top edge. Since terminal 1450a is an input, its multiplexer 1410a is programmed off, and its driver 1440a is programmed on. Since terminal 1450b is an output, its multiplexer 1410b is programmed on, and selecting the wire 1430 driven by driver 1440a.

Figure 10B:
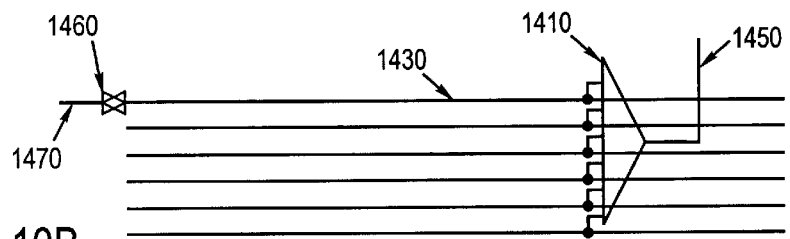

In FIG. 10b, a signal is input to the crossbar on terminal 1470 on the end of the structure, and routed through to output terminal 1450, on the top edge. Since terminal 1470 is an input, its bidirectional transceiver 1460 is programmed to drive its wire 1430. Since terminal 1450 is an output, its multiplexer 1410 is programmed on, and selecting the wire 1430 driven by transceiver 1460.

Figure 10C:
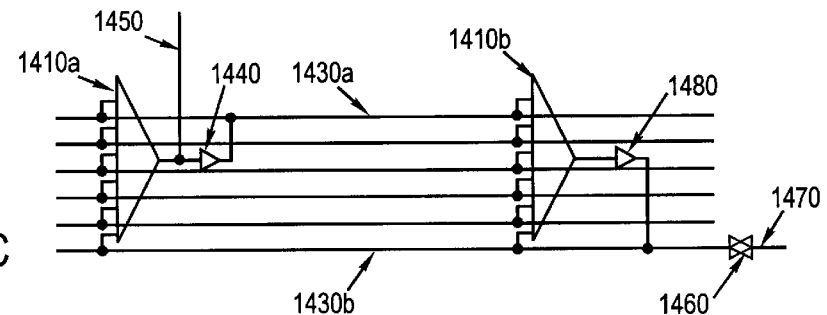

In FIG. 10c, a signal is input to the crossbar on terminal 1450 on the top edge of the structure, and routed through to output terminal 1470, on the end. Since terminal 1450 is an input, its multiplexer 1410a is programmed off, and its driver 1440 is programmed on. Since terminal 1470 is an output, its bidirectional transceiver 1460 is programmed to drive the terminal 1470.

Figure 10D:
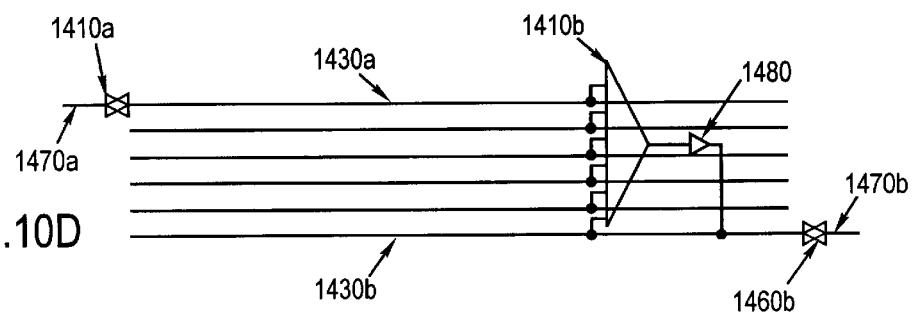

In FIG. 10d, a signal is input to the crossbar on terminal 1470a on the end of the structure, and routed through to output terminal 1470b, on the end. Since terminal 1470a is an input, its bidirectional transceiver 1460a is programmed to drive its wire 1430a. Since terminal 1470b is an output, its multiplexer 1410 is programmed on, and selecting the wire 1430a driven by transceiver 1460, and its driver 1480 is programmed on, driving its wire 1430b. The bidirectional transceiver 1460b on wire 1430b is programmed to drive the terminal 1470b.

Figure 11A:
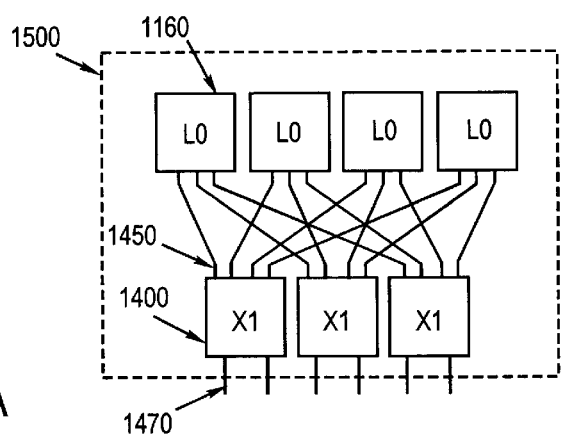
FIG. 11A is a block diagram of a partial crossbar interconnect structure using the crossbars of FIGS. 9A and 9B.
Figure 11B:
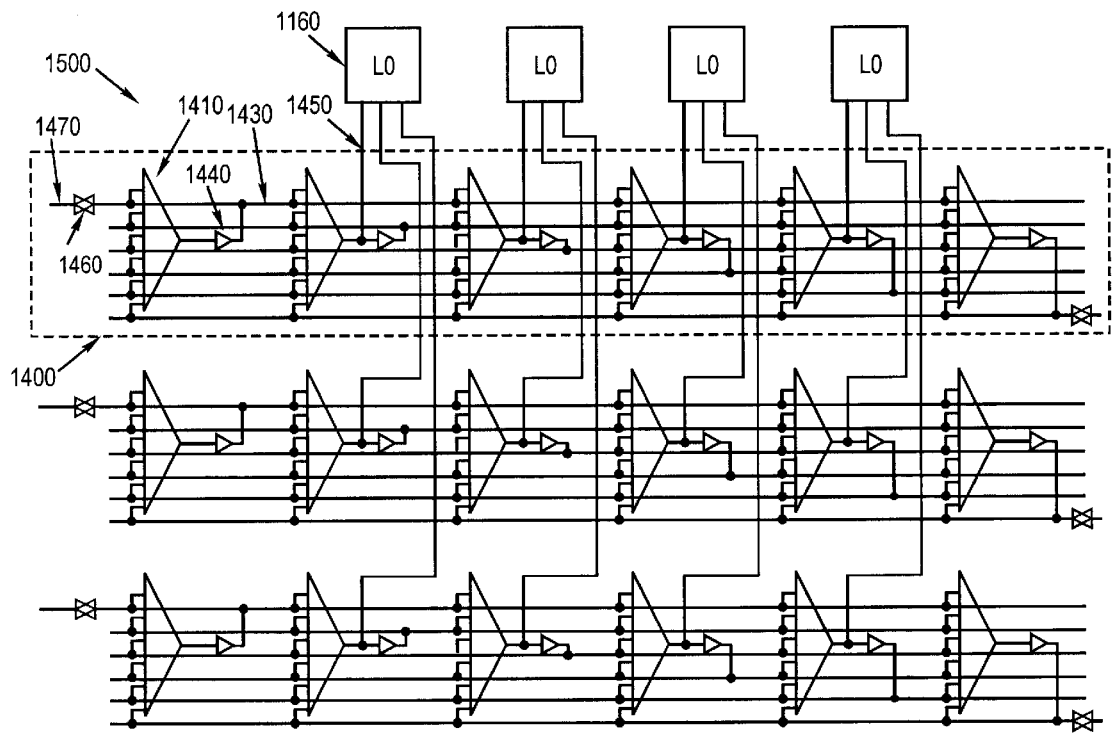
FIG. 11B is a more detailed block diagram of the partial crossbar interconnect structure of FIG. 11A, using the crossbars of FIGS. 9A and 9B.

FIGS. 11A and 11B show an exemplary partial crossbar interconnect using the crossbar 410 structures shown in FIGS. 9A, 9B, 10a, 10b, 10c and 10d. As shown in FIG. 11A, an L1 logic block 1500 is composed of four L0 logic blocks 1160, with three I/O pins each, interconnected by three X1 crossbars 1400, with four local terminals 1450 each and two external terminals each, which serve as the six I/O pins 1470 of the L1 logic block.

FIG. 11B shows the X1 crossbars 1400, L0 logic blocks 1160 and L1 I/O pins 1470, in their relative physical arrangements on the logic chip. The X1 crossbars 1400 stretch across the full width of the structure, the L0 logic blocks 1160 are arranged across the top edge, and the I/O pins 1470 are placed on the ends, three on the left and three on the right.

Figure 12A:
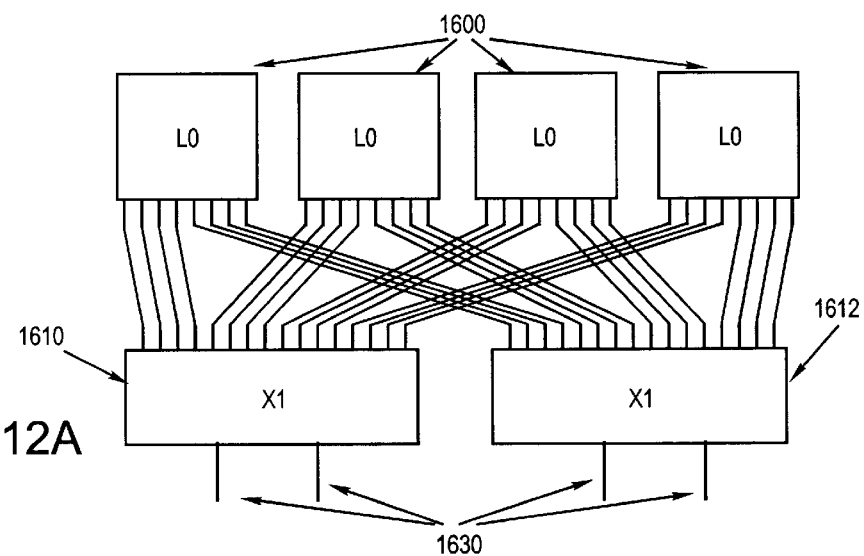
FIG. 12A is a block diagram of a partial crossbar interconnect structure.
Figure 12B:
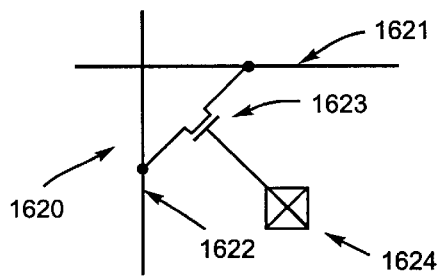
FIG. 12B is a block diagram of a pass-transistor crosspoint.
Figure 12C:
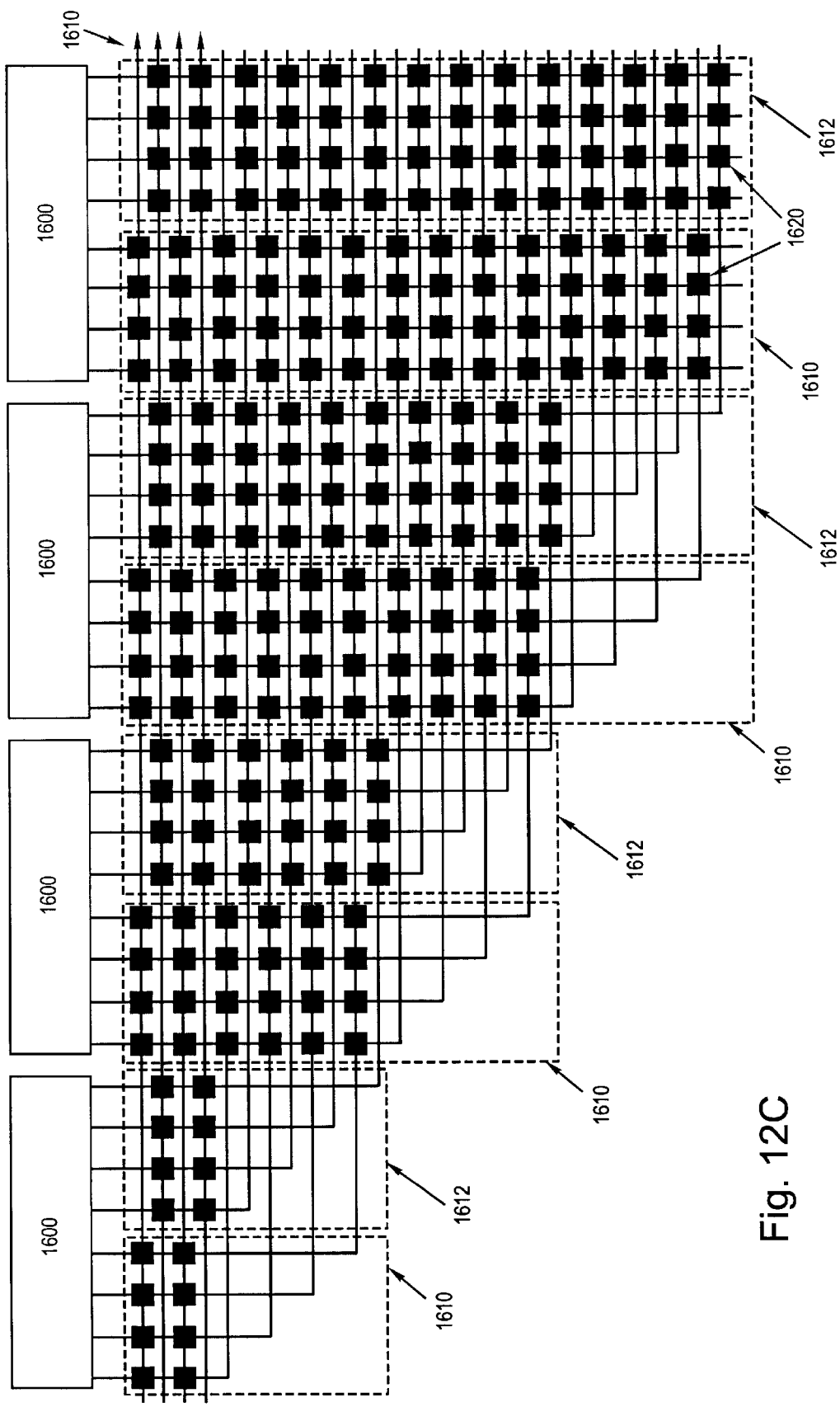
FIG. 12C is a block diagram of the physical layout of the partial crossbar interconnect structure using pass-transistor crosspoints.

FIGS. 12A–12C show an alternate implementation for crossbars 410 and a partial crossbar interconnect. FIG. 12A shows the L1 logic block used in this example. L1 logic block of FIG. 12A comprises four L0 logic blocks 1600, and two X1 crossbars, first X1 crossbar 1610 and second X1 crossbar 1612. In this embodiment, first X1 crossbar 1610 and second X1 crossbar 1612 are connected to the I/O pins of the L0 logic blocks 1600 by a partial crossbar interconnect. In this embodiment, first X1 crossbar 1610 and second X1 crossbar 1612 has sixteen local terminals, which correspond to local terminals 411. This allows for four connections to each of the four L0 logic blocks 1600. First X1 crossbar 1610 and second X1 crossbar 1612 also have two external terminals 1630, which correspond to external terminals 412, making up the four I/O pins for this L1 logic block.

FIG. 12B shows the details of a crosspoint 1620. Each crosspoint has a programming memory cell 1624, which controls a pass transistor 1623, either turning it on to be passing signals (i.e., creating a short circuit), or turning it off to be blocking them (i.e., creating an open circuit). The pass transistor joins the two wires 1621 and 1622 to which it is connected, either passing signals driven in either direction or blocking them.

FIG. 12C shows an embodiment of an L1 logic block comprised of two X1 crossbars (first X1 crossbar 1610 and second X1 crossbar 1612), four L0 logic blocks 1600, and L1 I/O pins 1630, in their relative physical arrangements on the logic chip. Note that the crosspoints 1620 of first X1 crossbar 1610 and second X1 crossbar 1612 are physically interleaved in their locations on the chip. The crosspoints of first X1 crossbar 1610 that connect to each L0 logic block are located directly next it. Thus each of the X1 crossbars will have some of its crosspoints next to each L0 logic block. The sum total of each X1 crossbar's (e.g., first X1 crossbar 1610 and second X1 crossbar 1612) crosspoints spans the entire width of the structure. Noting that a roughly triangular overall shape results, two such structures may be placed side-by-side such that their diagonals approximately fit together. The resulting pair of structures efficiently fills a rectangular area.

Given "L" logic blocks 1600 and "x" crossbars 1610, 1612, with each logic block 1600 having (x*i) pins and each crossbar 1610, 1612 having (L * i) plus "k" external pins each, there are "i" paths per logic block-crossbar pair. Denoting the area taken up by one programmable crosspoint 1620 a cell, each cell is crossed by "x" horizontal wires and one vertical wire. Thus, the total width can be written as (L*x*i) cells, and the total height is given by ((L−1)*i+k) cells. This interleaved structure allows for greater density, and hence space efficiency, than active crosspoints permit. However, as discussed above, active crosspoints like those of FIGS. 8, 9, 10 and 11 can provide greater speed and more uniform delay.

L0 Logic Block and X0 Interconnect Implementations

Figure 13A:
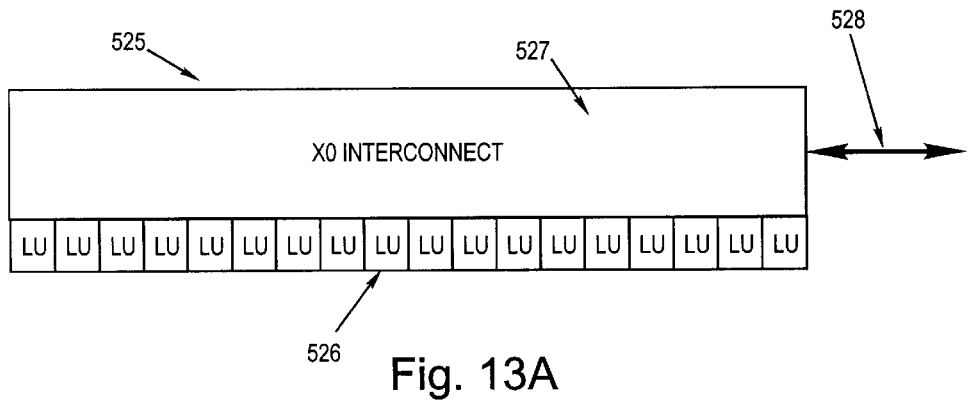
FIG. 13A is a block diagram of an L0 block.

FIG. 13A shows the basic components of an L0 logic block 525, in their relative physical arrangements on the logic chip. An X0 interconnect 527 has logic units (LUs) 526 placed along one or both of its long dimensions. The L0 block 525's I/O pins 528 are located on one or both ends of the X0 interconnect 527. The X0 interconnect 527 may be constructed in one of many different forms, including a fully populated simple crossbar, or a partially populated simple crossbar, or a combination of both.

Figure 13B:
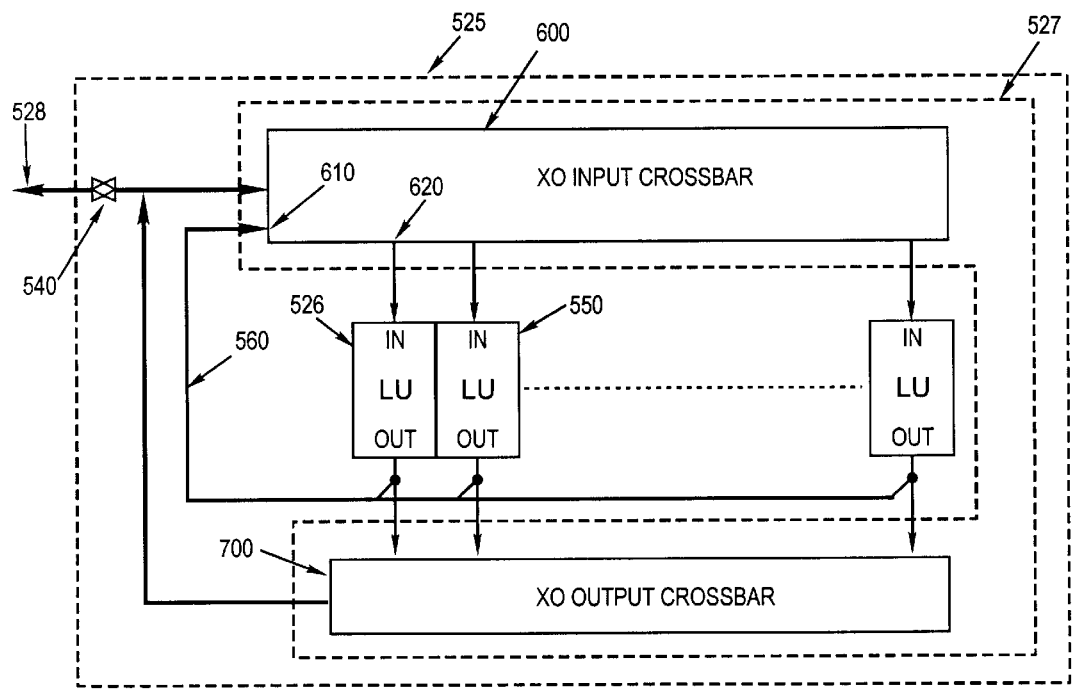
FIG. 13B is a block diagram of the LUs and X0 crossbars of the L0 logic block.

FIG. 13B shows one possible implementation of the X0 interconnect 527 in an L0 logic block 525. X0 interconnect 527 is composed of two crossbars, the X0 input crossbar 600 and the X0 output crossbar 700. This permits each crossbar to be optimized according to its function. The X0 input crossbar 600 gets inputs from the LU outputs 560, and from the L0 logic block I/O pins 528. The outputs of the X0 input crossbar 600 are connected to the inputs 550 of each of the LUs 526. The X0 output crossbar 700 gets inputs from the LU outputs 560. Its outputs are connected to the L0 logic block I/O pins 528. Each L0 logic block I/O pin 528 has a programmable bidirectional transceiver 540. Programmable bidirectional transceiver 540 drives in an output direction if the I/O pin 528 is programmed to be an output from the L0 logic block 525, driven by the X0 output crossbar 700. Programmable bidirectional transceiver 540 drives in an input direction if the I/O pin 528 is programmed to be an input to the L0 logic block 525, driven by the X1 crossbar 520 (shown in FIG. 7) to which it is connected.

The flexibility and compile speed of the programmable logic chip 400 will be maximized if the crossbars in the X0 interconnect 527 are simple full crossbars. The reason for this is that simple full crossbars can accomplish all possible interconnections directly. Thus, the compiler will not have to solve any routing problems such as the blocking of an interconnection because the resources necessary for such an interconnection were not available. One way to construct such a full crossbar is to provide a programmable crosspoint between every pair of input and output pins. An example of this is seen in FIG. 5 for local terminals 411. In a preferred embodiment, however, it is best if the L0 logic block 525 has as large a number of LUs 526 as is affordable. This makes the size of the X0 interconnect 527 large, which is especially costly since there are so many X0 interconnects in the entire L2 logic block 425.

Figure 13C:
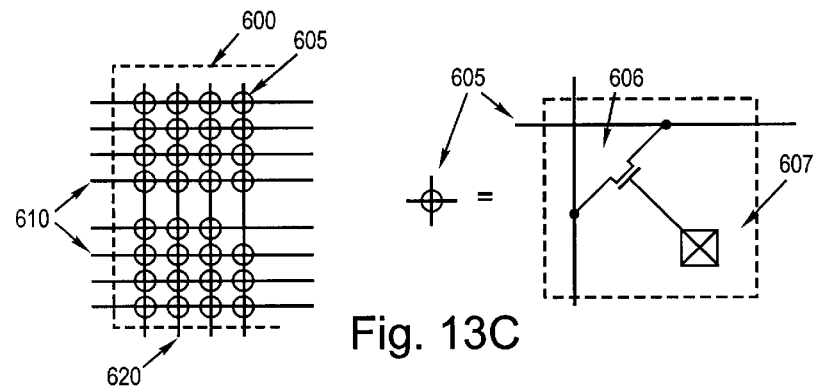
FIG. 13C is a block diagram of a fully populated crosspoint-type crossbar.

In crossbar 600 shown in FIG. 13C, there is a programmable crosspoint 605 interconnecting each possible input signal 610 to each output 620. Each of these crosspoints 605 contains a programmable memory cell 607 and a pass transistor 606. Out of all these crosspoints 605 connected to any one output 620, only one has its programmable memory cell 607 set to one (or "high"), and the others are all set to zero (or "low"). In an information encoding sense, the single number representing which input 610 is to be connected to the output 620, is represented in a fully decoded fashion, with one bit 607 for each value of the number. Thus, it is useful to speak of this as the fully decoded crosspoint-type crossbar. In contrast to this, a multiplexer-type crossbar (e.g., the multiplexer-type crossbar shown in FIG. 9 and discussed above) fully encodes this number in binary form in the multiplexer select memory cells 1411, with each combination of the bits 1411 representing a different choice of input. The number of memory cells that have to be fabricated onto the silicon wafer has a strong relationship on the chip area of the crossbar, as the programmable memory cells take most of the silicon area in practice. Thus, as the number of memory cells that are required increases, the size of the silicon chip increases as well.

Figure 13D:
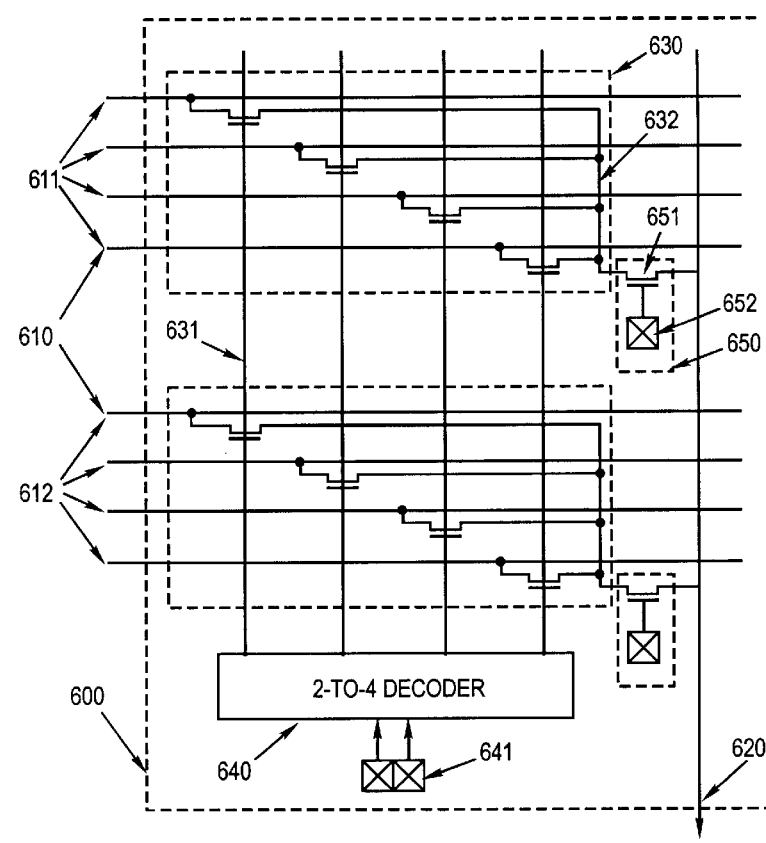
FIG. 13D is a block diagram of a fully populated hybrid multiplexer-crosspoint crossbar.

A hybrid between the fully decoded crosspoint-type crossbar and the fully encoded multiplexer-type crossbar is shown in FIG. 13D. The crossbar's input signals 610 are taken in groups. In the example of FIG. 13D, two groups are shown. The first group 611 comprises four input signals and the second group 612 comprises four input signals. For each crossbar output 620, there are as many four-input multiplexers 630, as there are groups. In the example of FIG. 13D, because there are two groups, there are two multiplexers 630. Each multiplexer 630 has what are commonly referred to as their data inputs connected to the input signals 611 (or 612) of its group. All multiplexers 630 serving a crossbar output 620 have what are commonly referred to as their select inputs 631 connected in common to a set of programming memory cells 641 via a binary decoder 640. This is acceptable because only one input signal 610 out of all input signals 610 will be ultimately selected for input. Therefore, the settings of all the other multiplexers 630 not connected to the selected input 610 have no effect on the crossbar output 620. Each multiplexer output 632 is connected via a programmable crosspoint 650 to the crossbar output 620. Each programmable crosspoint 650 has a pass transistor 651 and a programmable memory cell 652. Only the crosspoint 650 connected to the multiplexer 630 connected to the desired input signal 610 is programmed to be on. The other crosspoints 650 are programmed such that they are turned off.

Fewer programmable memory cells are needed in this organization. Therefore, the crossbar 600 requires less area on the chip. For example, if there are ninety-six inputs 610 to the X0 input crossbar 600, as in the preferred embodiment described below, the fully decoded crosspoint-type crossbar, as in FIG. 13C, would require ninety-six programmable memory cells 607 per crossbar output 620. In the hybrid multiplexer-crosspoint crossbar organization shown in FIG. 13D, the ninety-six inputs 610 would be broken into twenty-four groups. Each output 620 would have twenty-four multiplexers 630, all controlled by two programming memory cells 641 (as discussed, the number of programming memory cells 641 does not increase). Each output 620 would have twenty-four crosspoints 650 connecting the multiplexer outputs 632 to the crossbar output 620. Thus a total of twenty-six programming memory cells total per crossbar output 620 are needed.

If instead, a fully encoded multiplexer-type crossbar were used, with only one ninety-six input multiplexer 630 and no crosspoints 650, it would require ninety-six pass transistors and ninety-six select inputs 631 if it were constructed like the multiplexer 630 shown in FIG. 13D. This is extremely expensive. Further, if a binary-tree type of pass-transistor multiplexer, of the type well known in the multiplexer art, was used instead, the signal would have to pass through seven pass transistors in series. Because each pass transistor adds resistance and capacitance to a signal path, speed and signal quality would be degraded when seven pass transistors are utilized. Thus the hybrid multiplexer-crosspoint crossbar shown in FIG. 13D strikes a good balance between economy of encoding and minimizing the signal delay path.

Figure 13E:
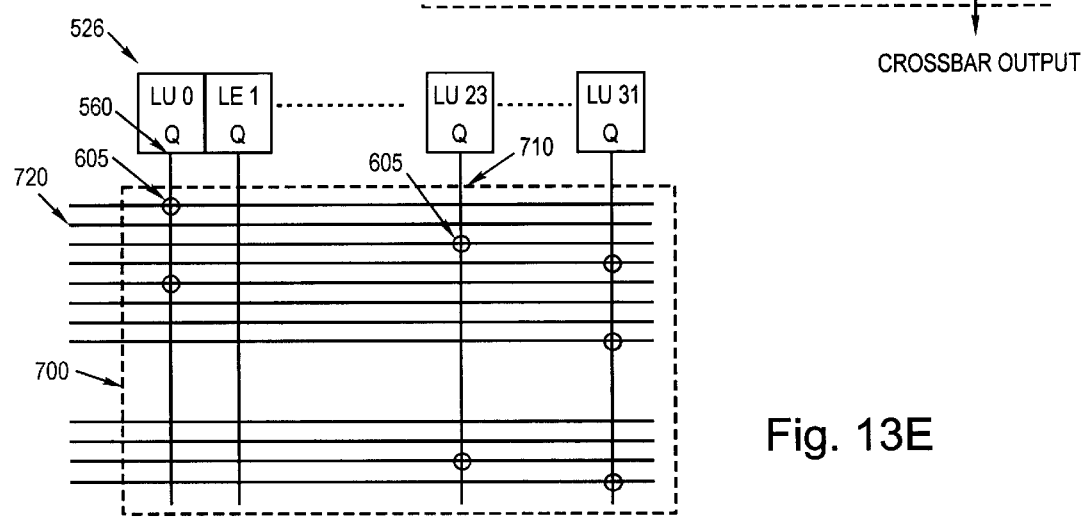
FIG. 13E is a block diagram of a partially populated crosspoint-type X0 output crossbar.

Another alternative for decreasing the number of programmable memory cells in a crossbar is to use a decoded crosspoint-type crossbar configuration, as in FIG. 13C, but to only partially populate it with programmable crosspoints 605. In other words, not all the possible input signals are connectable to each output. Such a crossbar is shown in FIG. 13E, where it is used as the X0 output crossbar 700. LUs 526 each have their LU outputs 560 connected to the input terminals 710 of the crossbar 700. Programmable crosspoints 605 can connect inputs 710 to output terminals 720. Only some of the possible crosspoint locations are occupied by crosspoints 605.

In general, given a set of interconnections required between X0 output crossbar input terminals 710 and output terminals 720, a partial population of crosspoints 605 will often fail to provide the interconnections. However, if the signal sources on input terminals 710 are free to be rearranged, it can be seen that a higher success rate is achievable. Given a destination output terminal 720, the source can be placed such that it drives an input terminal 710 which does have a crosspoint 605 joining it to the destination output 720. In the L0 logic block 525 organization shown in FIG. 13B, the uniformly identical LUs 526 may be rearranged in any relative placement, since the fully populated input crossbar 600 can accomplish any connection to their inputs 550.

Likewise, if the signal destinations connected to the output terminals 720 are free to be rearranged to some extent, then a higher success rate is achievable. The destination can be placed such that it is connected to an output terminal 720 that does have a crosspoint 605 joining it to the source input 710. In the L0 logic block 525 shown in FIG. 13B, the four X0 output crossbar outputs which connect to the same X1 crossbar 520 may be rearranged in any relative placement. The reason for this is that the fully populated X1 crossbar 520 can accomplish any connection from its local terminals 916 to other local terminals 916 and/or external terminals 915. If both signal sources and signal destinations have some freedom of rearrangement, then both freedoms may be taken advantage of in this way to allow connections to be accomplished even though the crossbar is only sparsely populated with crosspoints 605.

Thus, this partially populated X0 output crossbar 700 can be used with a very high rate of success in spite of its partial population. A routing stage in the compiler that prepares programming for the L0 logic block 525 works out the assignment of logic into specific physical logic units 526. The compiler does this simultaneously while working out the programming of the crosspoints 605 in the X0 input crossbar 600 and the X0 output crossbar 700, and further specifying the programming of the X1 crossbars 520.

Preferred Embodiment

Figure 14:
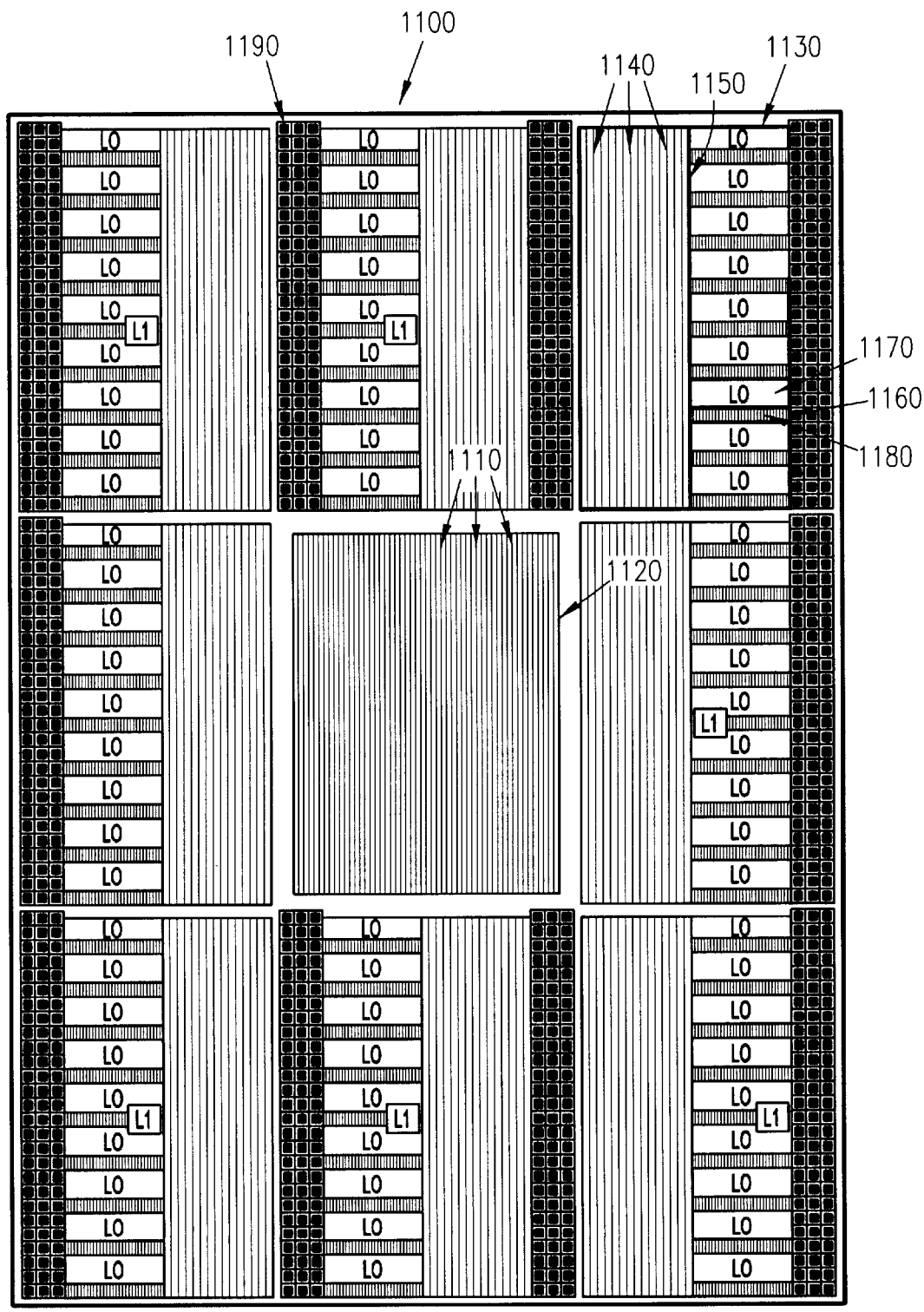
FIG. 14 is a diagram of a chip, showing the physical arrangement of L1 and L0 blocks and interconnects.

In a preferred embodiment, a programmable logic chip optimized for emulation and prototyping is shown in FIG. 14. It contains a single L2 logic block 1100. The L2 logic block 1100 architecture is organized according to the chip floor plan depicted in FIG. 14. The L2 logic block 1100 is structured to function as an optimized emulation and prototyping chip.

In the L2 chip architecture 1100, a plurality of X2 crossbars 1110 form an X2 partial crossbar interconnect 1120 between a plurality of L1 logic blocks 1130. Each L1 logic block 1130 contains a plurality of X1 crossbars 1140, which form an X1 partial crossbar interconnect 1150 between a plurality of L0 logic blocks 1160. Each L0 logic block 1160 contains an X0 interconnect 1170, which interconnects a plurality of LUs 1180.

There are fifty-two X2 crossbars 1110 in the X2 partial crossbar interconnect 1120. Each X2 crossbar 1110 is of the multiplexer type, as shown in FIGS. 9, 10, 11 and 12. Each X2 crossbar has thirty-two (32) local terminals, each of which is connected to an L1 logic block I/O pin. Each X2 crossbar has ten (10) external terminals, each of which is an L2 logic block I/O pin 1190. The L2 logic block 1100 includes six hundred thirty (630) pads 1190, of which five hundred twenty (520) are pads connected to L2 logic block I/O pins 1190. The remaining pads are used for secondary control purposes, and for power and ground connections.

There are eight L1 logic blocks 1130, each containing 208 I/O pins and an X1 partial crossbar interconnect 1150, which comprises sixteen X1 crossbars 1140. Each X1 crossbar 1140 is of the multiplexer type, as shown in FIGS. 9, 10, 11 and 12. Each X1 crossbar has thirty-six (36) local terminals, each of which is connected to an L0 logic block I/O pin. Each X1 crossbar has thirteen (13) external terminals, each of which is an L1 logic block I/O. Each L1 logic block 1130 contains nine L0 logic blocks 1160, each of which includes sixty-four I/O pins and an X0 interconnect 1170, which connects thirty-two logic units (LUs) 1180. Each LU 1180 contains a memory element, a flip-flopl/latch, and a programmable delay element. There are two hundred eighty-eight (288) LUs 1180 within each L1 logic block 1130. Therefore, there are two thousand three hundred four (2304) LUs 1180 within the L2 logic block 1100.

Figure 15:
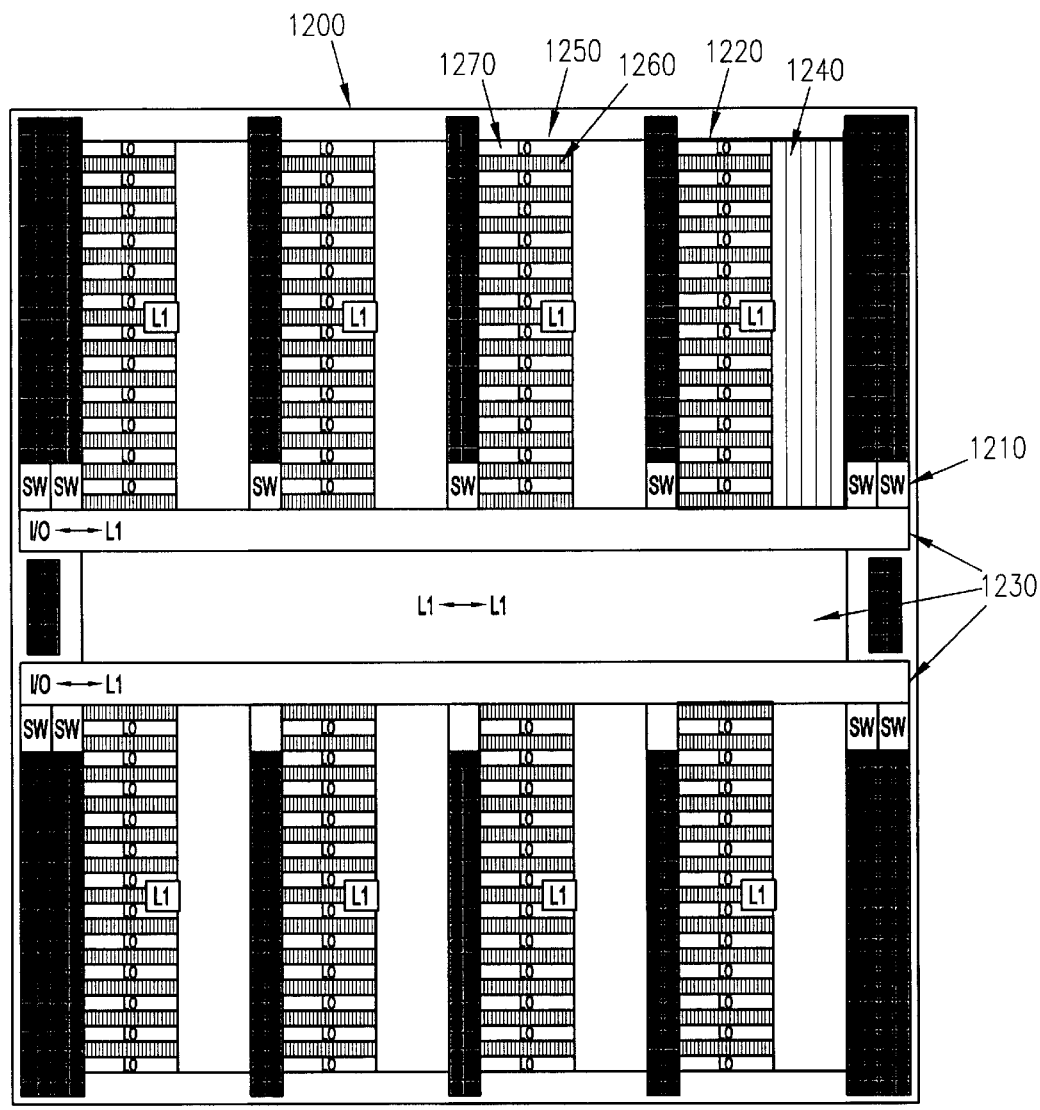
FIG. 15 is a diagram of a chip, showing a different physical arrangement of other L1 and L0 blocks and interconnects.

Such an L2 logic block on a programmable logic chip may be arranged according to many other possible layouts, the choice of which is dictated only by efficiency of size and routing. For example, in contrast to the physical arrangement of the L2 logic block 1100 of FIG. 14, an L2 logic block 1200 can be arranged according to an alternate embodiment, as shown in FIG. 15. The L2 logic block 1200 also has two thousand three hundred four (2304) LUs total. The L2 logic block 1200 has six hundred sixteen (616) I/O pins that are connected to the L2 logic block 1200 via fourteen pin swapping crossbars 1210, which facilitate the routability of the interconnect, even if the top-level input and output nets in the input design are pre-assigned to specific L2 I/O pins. Pin swapping crossbars 1210 can also be time multiplexed for pin sharing. The L2 logic block 1200 also includes an X2 interconnect 1230 that uses active crosspoints.

Eight L1 logic blocks 1220 are included within the L2 logic block 1200. Each L1 logic block 1220 has two hundred twenty-one (221) 110 pins, an X1 interconnect 1240 that uses passive crosspoint crossbars of the type shown in FIG. 12, and twelve L0 logic blocks 1250. Each L0 logic block 1250 has twenty-four LUs 1260 and an X0 interconnect network 1270.

Figure 16:
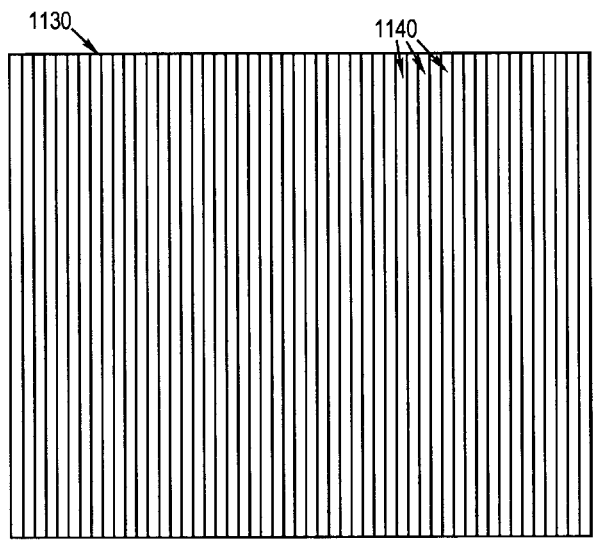
FIG. 16 is a diagram of the X2 interconnect of FIG. 14, showing physical arrangement of X2 crossbars.
Figure 17:
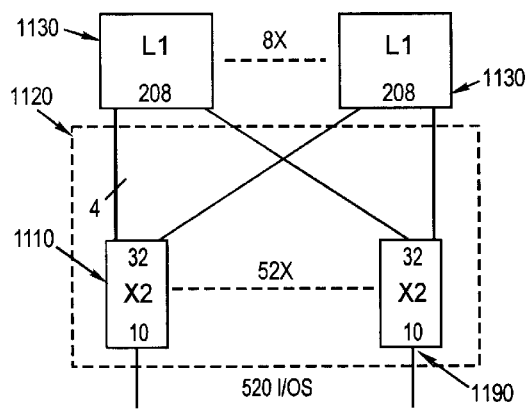
FIG. 17 is a block diagram illustrating connections between L1 logic blocks and X2 crossbars in the chip of FIG. 14.
Figure 19:
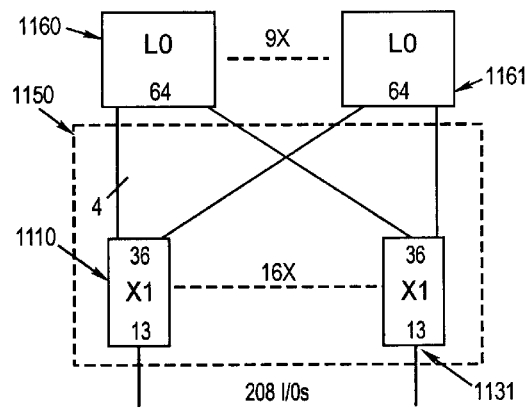
FIG. 19 is a block diagram illustrating connections between L0 logic blocks and X1 crossbars in the L1 logic block of FIG. 18.

In a presently preferred embodiment, the X2 crossbars 1110 of the L2 chip 1100 of FIG. 14 can be physically arranged as depicted in FIG. 16. The X2 crossbars 1110 interface logically with the L1 logic blocks 1130 to create the X2 partial crossbar interconnect 1120 shown in FIG. 17. This X2 partial crossbar interconnect 1120 is constructed with multiplexer-type crossbars in the fashion shown in FIGS. 8, 9, 10 and 11. Thus, in a presently preferred embodiment, fifty-two X2 crossbars 1110 each contain forty-two terminals (shown as single lines for simplicity)—thirty-two local terminals and ten external terminals. Four of the local terminals are connected to I/O pins 1131 on each of the eight L1 logic blocks 1130. The external terminals are L2 logic block I/O pins connected to logic chip I/O pads 1190, which in this presently preferred embodiment will total five hundred twenty (520). Each X2 crossbar 1110 contains forty-two 42-input multiplexers 1410 (not shown).

Figure 18:
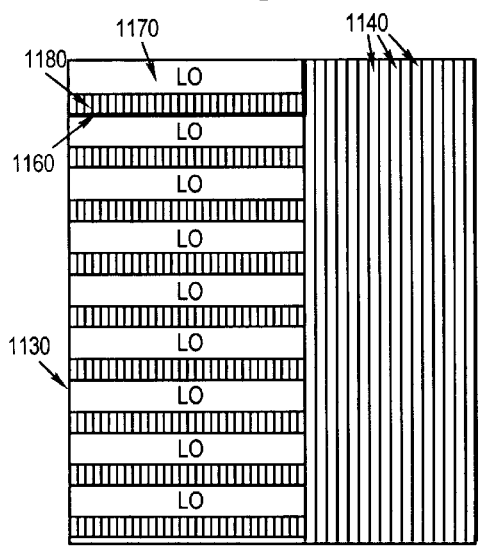
FIG. 18 is a diagram of an L1 logic block, showing the physical arrangement of X1 crossbars, and L0 logic blocks.

The X1 crossbars 1140, L0 logic blocks 1160, and LUs 1180 of an L1 logic block 1130 can be physically arranged as shown in FIG. 18. The X1 crossbars 1140 interface logically with the L0 logic blocks 1160 to form the X1 partial crossbar interconnect 1150 depicted in FIG. 19. This X1 partial crossbar interconnect 1150 is constructed with multiplexer-type crossbars in the fashion shown in FIGS. 8, 9, 10 and 11. Thus, sixteen X1 crossbars 1140 each include thirteen external terminals, for a total of two hundred eight L1 logic block I/O pins 1131 to the rest of the L2 logic block 1100, and thirty-six local terminals, connected in fours to 1/O pins 1161 on nine L0 logic blocks 1160. (For simplicity, the pins are depicted as single lines.) Each X1 crossbar 1140 contains forty-nine 49-input multiplexers 1410 (not shown).

Figure 20:
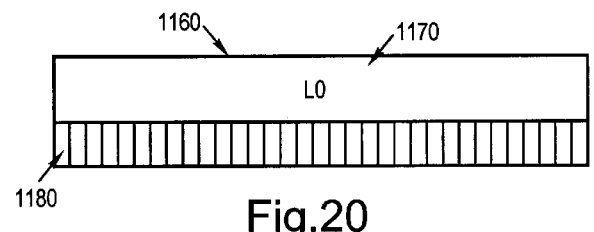
FIG. 20 is a diagram of an L0 logic block, showing the physical arrangement of its components.

In a presently preferred embodiment, an L0 logic block 1160 is arranged as shown in FIG. 20. The L0 logic block 1160 shown in FIG. 20 is arranged such that an X0 interconnection network 1170 interconnects thirty-two LUs 1180. The X0 interconnect network 1170 includes sixty-four I/Os. In a presently preferred embodiment, a single fully populated input crossbar feeds the LU inputs from the L0 I/O pins and the LU outputs, and a single partially populated output crossbar connects the LU outputs with the L0 I/O pins.

Figure 21:
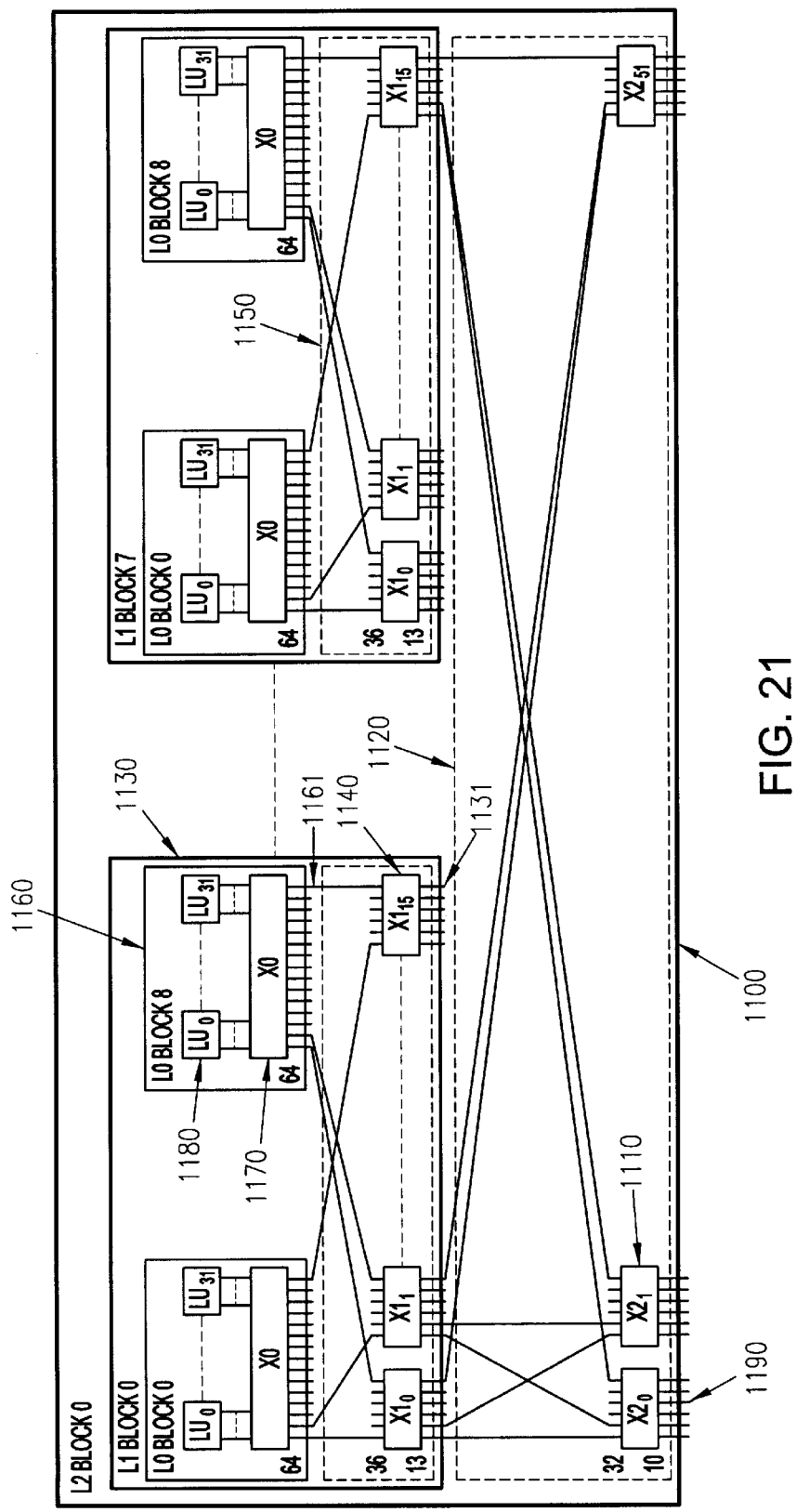
FIG. 21 is a block diagram of the chip routing architecture for the chip of FIG. 14.

In a preferred embodiment, the L2 logic block 1100 arrangement of FIG. 14 comprises a programmable logic chip routing architecture 1100 depicted in FIG. 21, which summarizes graphically the interconnections described above with reference to FIGS. 16–20.

Figure 22A:
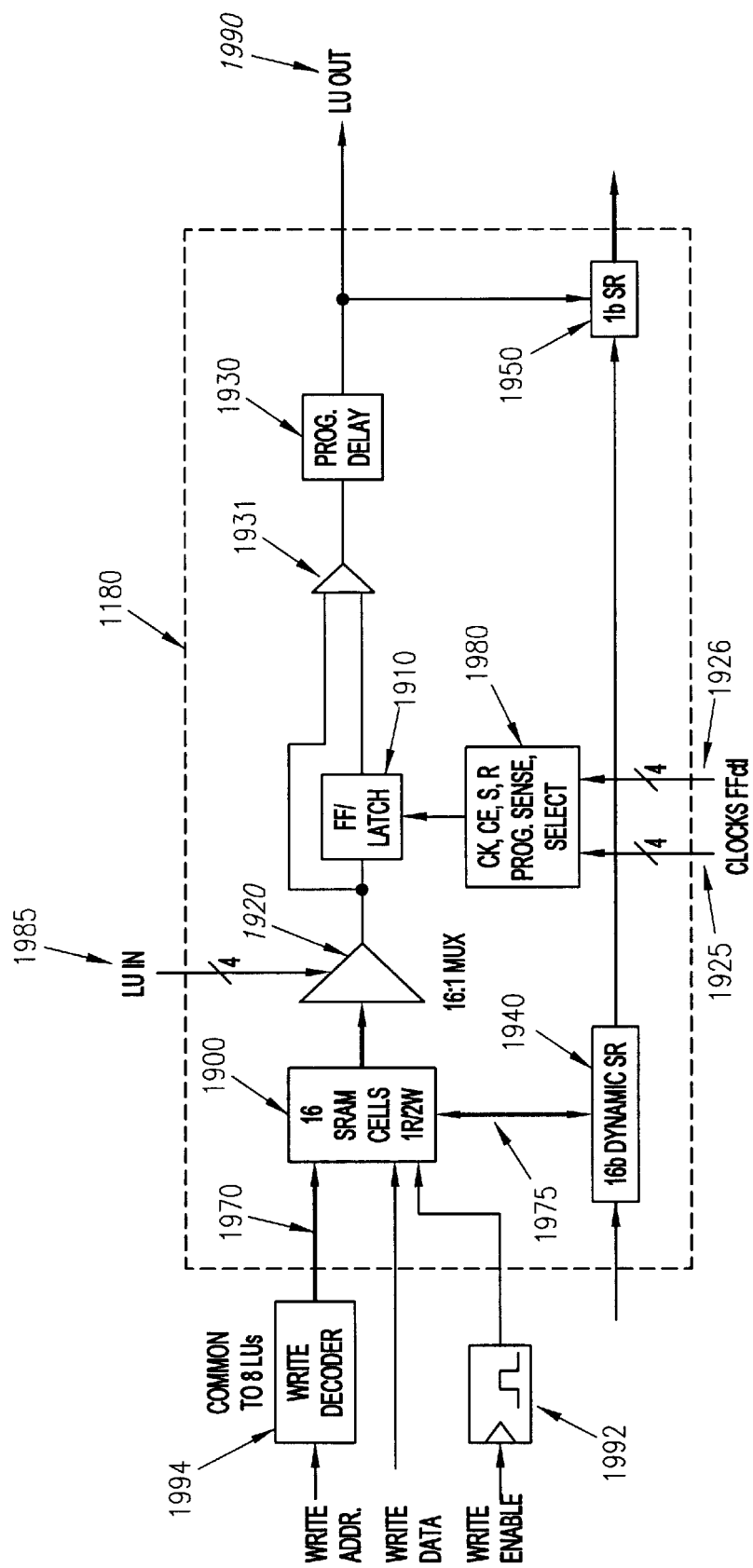
FIG. 22A is a block diagram of a logic unit used in the L0 logic block of FIG. 18.

In a presently preferred embodiment, an LU 1180 is implemented as shown in FIG. 22A. The LU 1180 includes a 16-bit static RAM memory 1900 and a flip-flop or latch circuit 1910. The presently preferred LU 1180 also comprises a 16:1 multiplexer 1920 and a programmable delay element 1930. In addition, the presently preferred LU 1180 also comprises a sixteen-bit dynamic shift register 1940 and a one-bit shift register 1950. The sixteen-bit dynamic shift register 1940 and one-bit shift register 1950 are used for programming.

The presently preferred LU 1180 uses data selector logic to accomplish its combinational logic functions. An SRAM 1900 is programmed with the truth table of a logic function. The four LU inputs 198 are used to select one of the 16 SRAM bits, via multiplexer 1920. A programmable flip-flop/latch 1910 is available for logic value storage. The flip-flop/latch 1910 may be programmed to operate either as an edge-triggered D flip-flop, or as a transparent latch. Flip-flop/latch 1910 is otherwise of the conventional type, with data, clock, clock enable, preset and clear inputs, and one output. Programmable multiplexer 1931 selects either the output of multiplexer 1920, for purely combinational LU operation, or the output of the flip-flop/latch 1910. This selects either registered or latched LU operation. This value then passes through a programmable delay element 1930, which may be programmed for no delay, or for one or more time delay values. The ability to program time delays through the use of programmable delay element 1930 is important because it allows the LU 1180 to be used for resolving hold-time violations. It can also be used for other timing purposes, such as delays that intentionally designed into the user's design. The output of LU 1180 is LU output 1990.

In a presently preferred embodiment, a set of four clock signals 1925 is distributed to all LUs 1180 in the entire L2 logic block 1100. A set of four flip-flop control signals 1926 is distributed to all LUs 1180 in each L0 logic block 1160. Programmable logic 1980 can select from among the clock signals 1925 and control signals 1926, and provide clock, clock enable, preset and clear signals, as programmed, to the flip-flop/latch 1910. Logic 1980 can also programmably invert any of these signals if desired.

The memory cells (not shown) within SRAM 1900 are programmed from the sixteen-bit shift register 1940 into a dedicated write port 1975. Thus, an LU 1900 may be selectively programmed during operation of the L2 logic block 1100. The contents of the LU 1900 can also be read back into the sixteen-bit shift register 1940. Also, the LU output 1990 can be sampled into the 1-bit shift register 1950, and read back rapidly while the L2 logic block 1100 is running. The programming shift registers 1940 and 1950 of each LU in an L0 logic block 1160 are connected in series. These shift registers 1940 and 1950 are each connected in series across the entire L2 logic block 1100, and connected through control logic to a standard serial interface, such as an IEEE Standard 1149 JTAG test port. This programming control logic also provides the control signals necessary to program the SRAM 1900 cells, and all the other programmable memory cells in the L2 logic block 1100.

Figure 22B:
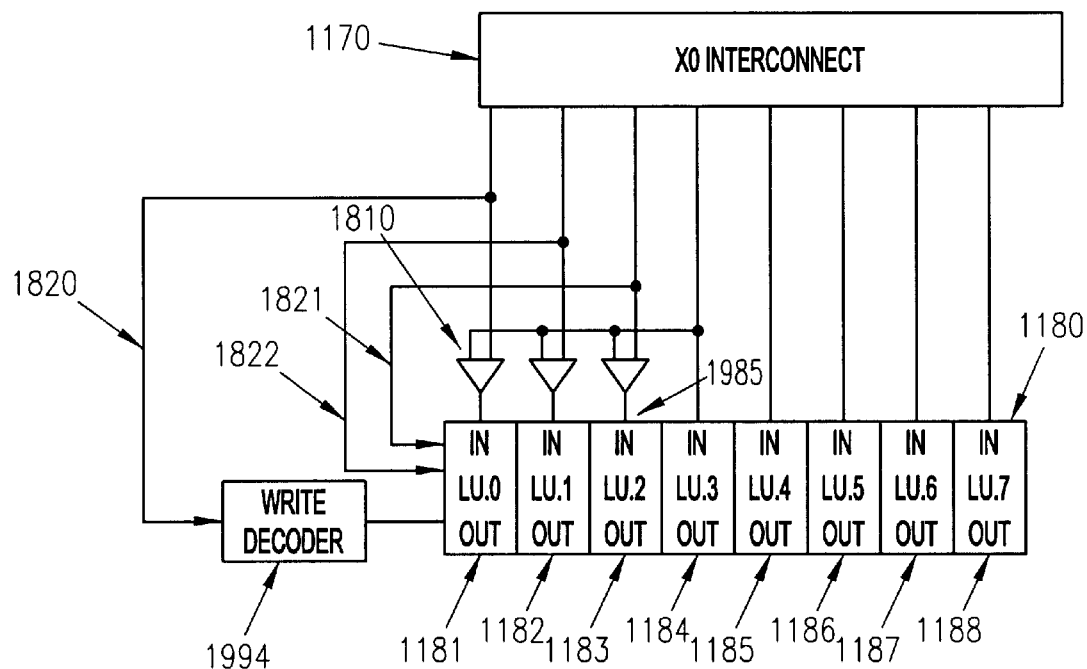
FIG. 22B is a block diagram showing facilities for using a group of the logic units as a memory.

In a presently preferred embodiment, groups of eight LUs 1180 (shown as LUs 1181–1188) are grouped together as shown in FIG. 22B so that, if desired, they can be programmed to act as a sixteen word by eight bit memory. The SRAM 1900 in each LU 1180 (LUs 1181–1188 of FIG. 22B) acts as one bit of the eight bit memory. This memory has a read port and a write port. The read port reads the data stored in the memory cells of SRAM 1900 using the LU input 1985 and multiplexer 1920. A write decoder 1994 and a write enable pulse generator 1992, common to all eight LUs 1181–1188, writes data into the memory cells of each SRAM 1900. The four write address bits are taken from the signals normally used for one of the LUs, LU 1181, as shown in FIG. 22B. Three multiplexers 1810 are inserted between the inputs of three of the LUs 1180, which in this embodiment are LUs 1181, 1182 and 1183, and the X0 interconnect 1170. Normally these multiplexers are set to pass the signals through from X0 interconnect 1170 to each of those LU's inputs 1985. When the group of eight LUs is programmed for use as a memory, the three multiplexers 1810 are switched instead to copy the input signals being sent to the inputs 1985 of the fourth LU 1184, to the inputs 1985 of the first three, 1181, 1182 and 1183. This allows the 4 signals from the X0 interconnect 1170 that are normally sent to the inputs 1985 of the first LU 1181 to be used for the write address 1820, sent to the write decoder 1994. It also allows the 8 signals from the X0 interconnect 1170 that are normally sent to the inputs 1985 of the second and third LUs 1182 and 1183 to be used for the write data inputs to each of the eight LUs in the group. The write enable input to the write enable pulse generator 1992 is taken from one of the control signals 1926.

Figure 23:
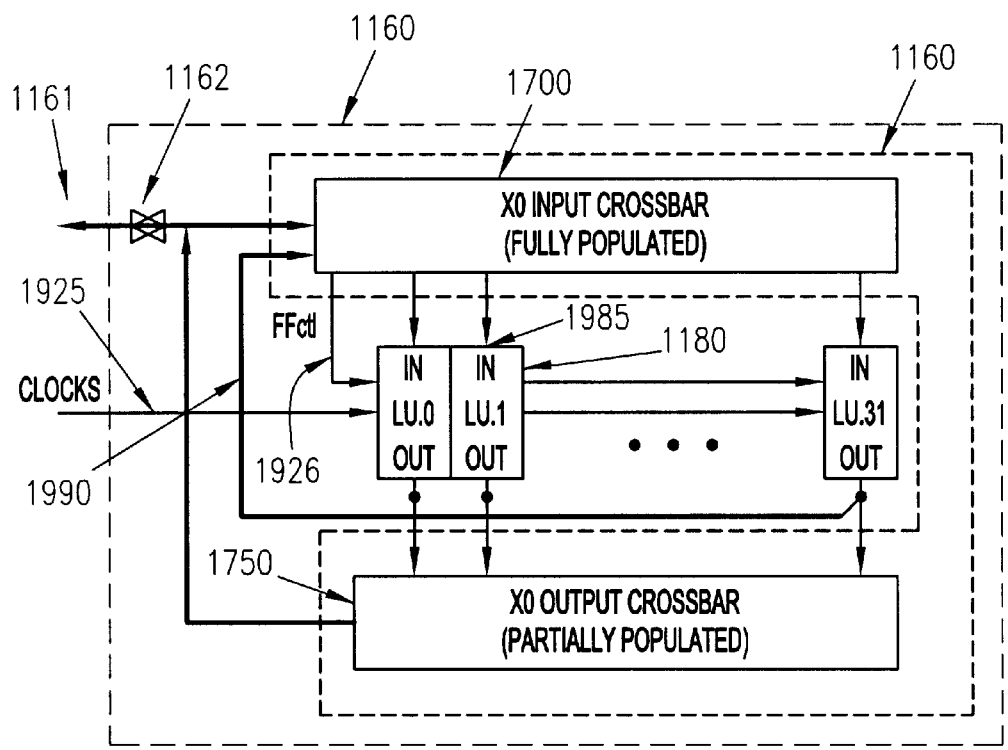
FIG. 23 is a block diagram of the logic units and X0 crossbars of the L0 logic block of FIG. 18.

FIG. 23 shows the internal structure of the L0 logic block 1160 in this preferred embodiment. The multiplexers 1810 are not shown in the interest of clarity. X0 interconnect 1170 is composed of two crossbars, the X0 input crossbar 1700 and the X0 output crossbar 1750. The X0 input crossbar 1700 gets inputs from the thirty-two LU outputs 1990, and from the L0 logic block I/O pins 1161, totaling ninety-six inputs. Its outputs are connected to the four inputs 1985 of each of the thirty-two LUs 1180, totaling one hundred twenty-eight outputs, and to the four control inputs 1926 shared by all LUs. The X0 input crossbar 1700 is constructed using the hybrid multiplexer-crosspoint crossbar organization of FIG. 13D. Its ninety-six inputs are broken up into twenty-four groups of four inputs each, so each output has twenty-four four-input multiplexers and twenty-four multiplexer-to-output crosspoints.

The X0 output crossbar 1750 gets inputs from the thirty-two LU outputs 1990. Its sixty-four outputs are connected to the L0 logic block I/O pins 1161. Each L0 logic block I/O pin 1161 has a programmable bidirectional transceiver 1162. Bidirectional transceiver 1162 drives in an output direction if the I/O pin it is driving is programmed to be an output from the L0 logic block 1160, driven by the X0 output crossbar 1750. Bidirectional transceiver 1162 drives in an input direction if it is programmed to be an input to the L0 logic block 1160, driven by the X1 crossbar 1140 to which it is connected. The X0 output crossbar is a partially populated crosspoint-type crossbar of the type shown as crossbar 700 in FIG. 13E, and discussed above.

Figure 24:
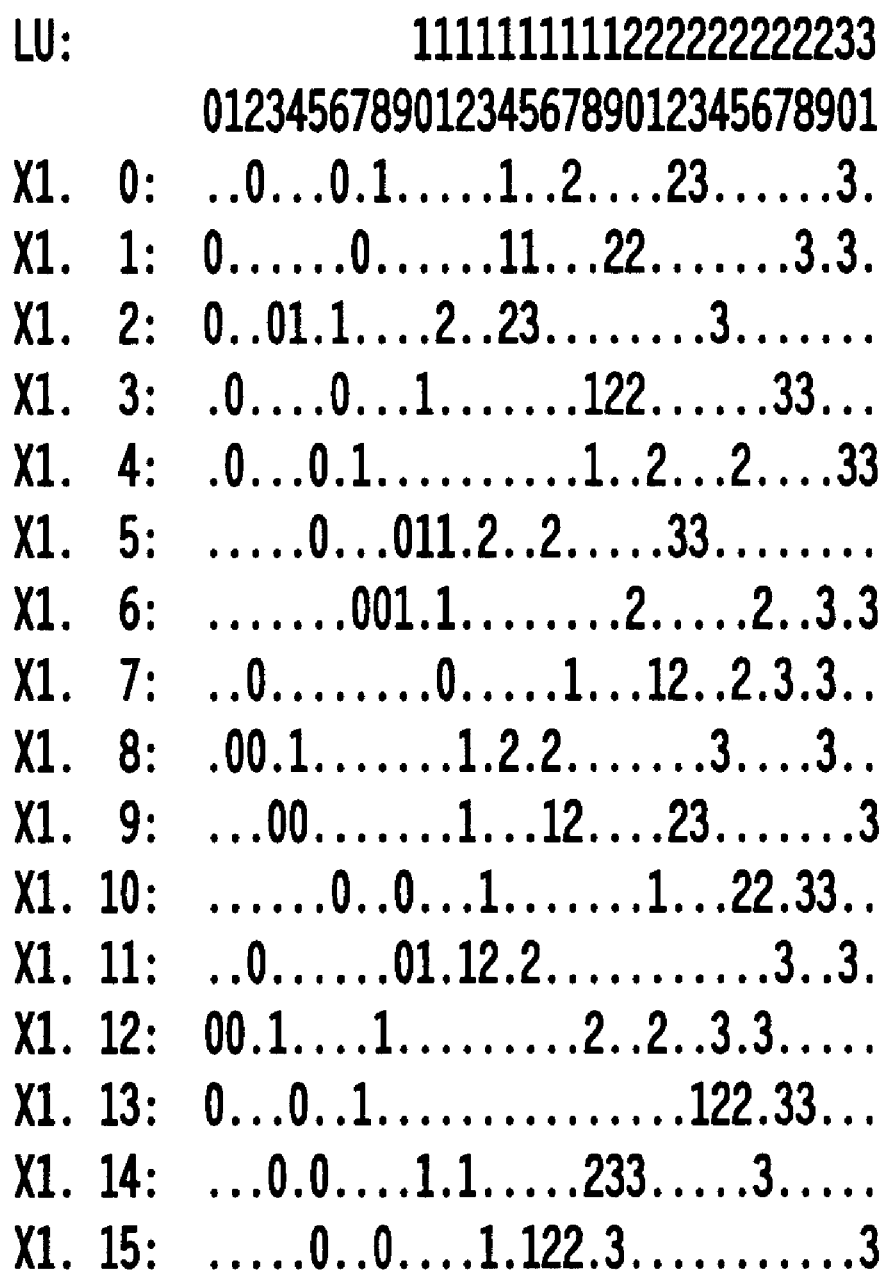

FIG. 24 shows the pattern of population for the crosspoints 605 (shown in FIG. 13E) in the X0 output crossbar 1750. Each column in the chart represents a single input terminal 710, connected to a single LU output 1990. Each row in the chart represents four output terminals 720, which are connected to the four X0 logic block I/O pins 1161 that connect to a single X1 crossbar 1140. If a row-column entry shows a ".", there is no crosspoint 605 connecting the input terminal 710 for that column to any of the output terminals 720 for that row. If a row-column entry shows a number (0, 1, 2 or 3), there is a crosspoint 605 connecting the input terminal 710 for that column to one of the output terminals 720 for that row. Which one of the four output terminals 720 is connected is denoted by the number in the row-column entry. It will be seen that each input terminal 710 has four crosspoints 605 connecting it to output terminals 720. Since a fully populated crossbar would have 64 crosspoints 605 connected to each input terminal 710, this partially populated X0 output crossbar 1750 has only one-sixteenth the number of crosspoints, and thus one-sixteenth the area, of a fully populated equivalent crossbar.

Preferred embodiments of the present invention have thus been shown and described. It would be apparent to one of ordinary skill in the art, however, that numerous alterations may be made to the embodiments herein disclosed without departing from the spirit or scope of the invention. Therefore, the invention is not to be limited except in accordance with the following claims.

We claim:

1. An integrated circuit comprising:

a plurality of logic elements, said plurality of logic elements divided into a plurality of subsets of logic elements;

a plurality of first level interconnects, each of said plurality of first level interconnects interconnecting logic elements within one of said plurality of subsets of logic elements, thereby forming a plurality of first level logical units, said plurality of first level logical units divided into a plurality of subsets of first level logical units, each of said plurality of first level interconnects comprising input interconnect structures and output interconnect structures, said input interconnect structures and said output interconnect structures comprising a fully populated crossbar network;

a plurality of second level interconnects, each of said second level interconnects interconnecting one of said plurality of subsets of first level logic units, thereby forming a plurality of second level logic units, each of said plurality of second level interconnects comprising a partial crossbar architecture;

a third level interconnect, said third level interconnect interconnecting said plurality of second level logic units, thereby forming a third level logic unit, said third level interconnect comprising a partial crossbar architecture;

wherein each of said fully populated crossbar networks comprises:

a plurality of groups of inputs;

a plurality of multiplexers, each of said plurality of multiplexers comprising at least two data inputs, at least one select input and at least one output, each input of one said plurality of groups of inputs electrically communicating with said data inputs of a corresponding one of said plurality of multiplexers, said at least one select input on each of said plurality of multiplexers electrically connected to a decoder, said decoder electrically connected to a programming cell;

a programmable crosspoint in electrical communication between said at least one output of each of said plurality of multiplexers and a crossbar output pin, said programmable crosspoint comprising a pass transistor and a programmable memory cell.

2. The integrated circuit of claim 1 wherein each of said plurality of logic elements comprises data selector logic.

3. The integrated circuit of claim 1 further comprising a plurality of input/output pins.

4. The integrated circuit of claim 3 wherein said plurality of logic elements are configurable according to any digital logic network, subject to capacity limitations of each of said plurality of logic elements.

5. The integrated circuit of claim 4 wherein said third level interconnect freely connects said plurality of input/output pins with said digital logic network configured in said plurality of logic elements.

6. An integrated circuit comprising:
a plurality of logic elements, said plurality of logic elements divided into a plurality of subsets of logic elements;
a plurality of first level interconnects, each of said plurality of first level interconnects interconnecting logic elements within one of said plurality of subsets of logic elements, thereby forming a plurality of first level logical units, said plurality of first level logical units divided into a plurality of subsets of first level logical units, each of said plurality of first level interconnects comprising input interconnect structures and output interconnect structures, said input interconnect structures comprising a fully populated crossbar network and said output interconnect structures comprising a partially populated crossbar network;
a plurality of second level interconnects, each of said second level interconnects interconnecting one of said plurality of subsets of first level logic units, thereby forming a plurality of second level logic units, each of said plurality of second level interconnects comprising a partial crossbar architecture;
a third level interconnect, said third level interconnect interconnecting said plurality of second level logic units, thereby forming a third level logic unit, said third level interconnect comprising a partial crossbar architecture;

wherein said fully populated crossbar network comprises:
a plurality of groups of inputs;
a plurality of multiplexers, each of said plurality of multiplexers comprising at least two data inputs, at least one select input and at least one output, each input of one said plurality of groups of inputs electrically communicating with said data inputs of a corresponding one of said plurality of multiplexers, said at least one select input on each of said plurality of multiplexers electrically connected to a decoder, said decoder electrically connected to a programming cell;
a programmable crosspoint in electrical communication between said at least one output of each of said plurality of multiplexers and a crossbar output pin, said programmable crosspoint comprising a pass transistor and a programmable memory cell;

wherein said partially populated crossbar network comprises:
a plurality of inputs;
a plurality of outputs;
a plurality of programmable crosspoints in electrical communication between some of said plurality of inputs and some of said plurality of outputs, said programmable crosspoint comprising a pass transistor and a programmable memory cell.

7. The integrated circuit of claim 6 wherein each of said plurality of logic elements comprises data selector logic.

8. The integrated circuit of claim 6 further comprising a plurality of input/output pins.

9. The integrated circuit of claim 8 wherein said plurality of logic elements are configurable according to any digital logic network, subject to capacity limitations of each of said plurality of logic elements.

10. The integrated circuit of claim 9 wherein said third level interconnect freely connects said plurality of input/output pins with said digital logic network configured in said plurality of logic elements.

* * * * *